United States Patent
Zhao et al.

(10) Patent No.: US 10,028,397 B2
(45) Date of Patent: Jul. 17, 2018

(54) ELECTRONIC DEVICE WITH LIQUID-RESISTANT SIM TRAY AND AUDIO MODULE

(71) Applicant: Apple Inc., Cupertino, CA (US)

(72) Inventors: Xiao Ying Zhao, Santa Clara, CA (US); Timothy S. Lui, Cupertino, CA (US); Tyler B. Cater, Cupertino, CA (US); Rasamy Phouthavong, Campbell, CA (US); Scott A. Myers, Saratoga, CA (US); Benjamin J. Pope, Mountain View, CA (US); David A. Hurrell, San Mateo, CA (US); Christopher R. Xydis, San Franscico, CA (US); Edward S. Huo, Sunnyvale, CA (US); Richard Hung Minh Dinh, Saratoga, CA (US); Michael W. Firka, Cupertino, CA (US); Martin J. Auclair, Cupertino, CA (US); Kurtis J. Mundell, San Francisco, CA (US); Salome Bavetta, Sunnyvale, CA (US); Paul Leutheuser, Saratoga, CA (US); Hani Esmaeili, Santa Clara, CA (US); Kevin M. Froese, San Francisco, CA (US); Ihtesham H. Chowdhury, Los Altos, CA (US); Tang Yew Tan, San Francisco, CA (US); Eric W. Bates, Sunnyvale, CA (US); Yaocheng Zhang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/593,253

(22) Filed: May 11, 2017

(65) Prior Publication Data
US 2018/0110143 A1      Apr. 19, 2018

Related U.S. Application Data

(60) Provisional application No. 62/383,982, filed on Sep. 6, 2016.

(51) Int. Cl.
| | | |
|---|---|---|
| H04R 1/02 | (2006.01) | |
| H05K 5/02 | (2006.01) | |
| H05K 7/14 | (2006.01) | |

(52) U.S. Cl.
CPC .......... *H05K 5/0217* (2013.01); *H04R 1/025* (2013.01); *H05K 7/1461* (2013.01); *H04R 2499/11* (2013.01)

(58) Field of Classification Search
CPC .............................. H05K 5/0217; H04R 1/02
See application file for complete search history.

(56) References Cited

U.S. PATENT DOCUMENTS

| | | |
|---|---|---|
| 5,073,521 A | 12/1991 | Braden |
| 8,269,104 B2 | 9/2012 | Choraku et al. |

(Continued)

FOREIGN PATENT DOCUMENTS

| | | |
|---|---|---|
| JP | 5262798 B2 | 8/2013 |
| KR | 1020130114447 A | 10/2013 |

OTHER PUBLICATIONS

International Patent Application No. PCT/US2017/049342—International Search Report and Written Opinion dated Dec. 29, 2017.

*Primary Examiner* — Olisa Anwah
(74) *Attorney, Agent, or Firm* — Dickinson Wright RLLP

(57) ABSTRACT

An electronic device having several modifications designed to prevent liquid ingress into an opening (or openings) of the electronic device is disclosed. For example, the electronic device includes a SIM tray having a sealing element designed to provide a seal at an opening that receives the SIM tray. The sealing element may include a first section and (Continued)

a second section extending from the first section, with the first section designed to bend with respect to (and in some cases collapse onto) the second section. The electronic device may further include an audio module fitted with a sealing element. The sealing element may include extensions extending away from a main body of the sealing element, with some extension designed to engage the audio module, and other extensions designed to engage an audio module interface. The sealing element provides a seal against liquid ingress into the audio module.

28 Claims, 28 Drawing Sheets

(56) References Cited

U.S. PATENT DOCUMENTS

| | | | |
|---|---|---|---|
| 9,323,292 | B2 | 4/2016 | Bae et al. |
| 2006/0256510 | A1* | 11/2006 | Nakasono .......... G07C 9/00944 |
| | | | 361/679.02 |
| 2010/0304091 | A1 | 12/2010 | Wang |
| 2012/0113012 | A1 | 5/2012 | Cho et al. |
| 2012/0320503 | A1 | 12/2012 | Yturralde et al. |
| 2013/0058018 | A1 | 3/2013 | Song et al. |
| 2015/0092345 | A1* | 4/2015 | Ely ...................... G06F 1/1656 |
| | | | 361/679.55 |
| 2015/0295617 | A1 | 10/2015 | Lai et al. |
| 2016/0093961 | A1* | 3/2016 | Stephens .................. G06F 1/00 |
| | | | 439/64 |
| 2016/0259301 | A1* | 9/2016 | Ely ...................... G04B 37/081 |

* cited by examiner

ELECTRONIC DEVICE WITH LIQUID-RESISTANT SIM TRAY AND AUDIO MODULE

CROSS-REFERENCE TO RELATED APPLICATION(S)

This application claims the benefit of priority to U.S. Provisional Application No. 62/383,982, filed on Sep. 6, 2016, and titled "WATER RESISTANT FEATURES OF A PORTABLE ELECTRONIC DEVICE," the disclosure of which is incorporated herein by reference in its entirety.

FIELD

The following description relates to an electronic device. In particular, the following description relates to a portable electronic device that includes modifications to a tray used to carry a subscriber identification module ("SIM") card, and also relates to an audio module. The tray and the audio module are each fitted with a sealing element designed to provide a seal against liquid ingress, so that openings in the electronic device (associated with the tray and the audio module) prevent or limit liquid ingress into the electronic device.

BACKGROUND

Portable electronic devices generally include one or more openings. These openings allow for features and enhancements for the portable electronic device. For example, a portable electronic device can include an opening for a SIM tray. However, the opening leaves the portable electronic device vulnerable to liquid exposure, and possible damage to the portable electronic device.

Further, an additional opening can be used for an audio module. However, the same issue—liquid exposure—can also result from the opening. Even when the audio module is sealed, the portable electronic device may include other components used with the audio module. The interface between the audio module and the other components ultimately results in the potential for liquid ingress into the portable electronic device.

SUMMARY

In one aspect, an electronic device is described. The electronic device may include an enclosure that defines an internal volume. The electronic device may further include a through hole formed in the enclosure and having an internal surface. The through hole may be in communication with the internal volume. The electronic device may include a subscriber identification module (SIM) tray that is movable with respect to the enclosure. The electronic device may include a sealing element having a first section and a second section. The second section can be secured with the SIM tray. In some embodiments, when the SIM tray is inserted into the through hole the first section engages the internal surface such that a liquid is prevented from entering the internal volume via the through hole.

In another aspect, an electronic device is described. The electronic device may include an audio module that generates acoustical energy. The audio module may include a snout. The electronic device may further include an audio module interface that secures with the audio module. The electronic device may further include a sealing element that engages the audio module and the audio module interface. The sealing element may include a first extension and a second extension. The first extension may engage the audio module interface and the second extension may engage the snout. Also, the sealing element may form a seal that prevents a liquid from entering between the audio module and the audio module interface.

In another aspect, an electronic device is described. The electronic device may include an enclosure that defines an internal volume. The enclosure may include a through hole that opens to the internal volume. The electronic device may further include a button that generates a command to an operational component in the internal volume. The button may extend at least partially in the through hole. The electronic device may further include a sealing element secured with the button and engaging the enclosure at the through hole. The sealing element may provide a seal against a liquid at the through hole.

In another aspect, a method for forming an electronic device having an enclosure that includes an internal volume is described. The enclosure may include a through hole that opens to the internal volume. The method may include providing a SIM tray that carries a SIM card. The SIM tray can be movable with respect to the enclosure. The method may further include positioning a sealing element onto the SIM tray. The sealing element may include a first section and a second section. The second section may be secured with the tray. In some embodiments, in response to the SIM tray being inserted into the through hole, the through hole deforms the first section relative to the second section and the sealing element forms a seal from a liquid at the through hole.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Figure 1:
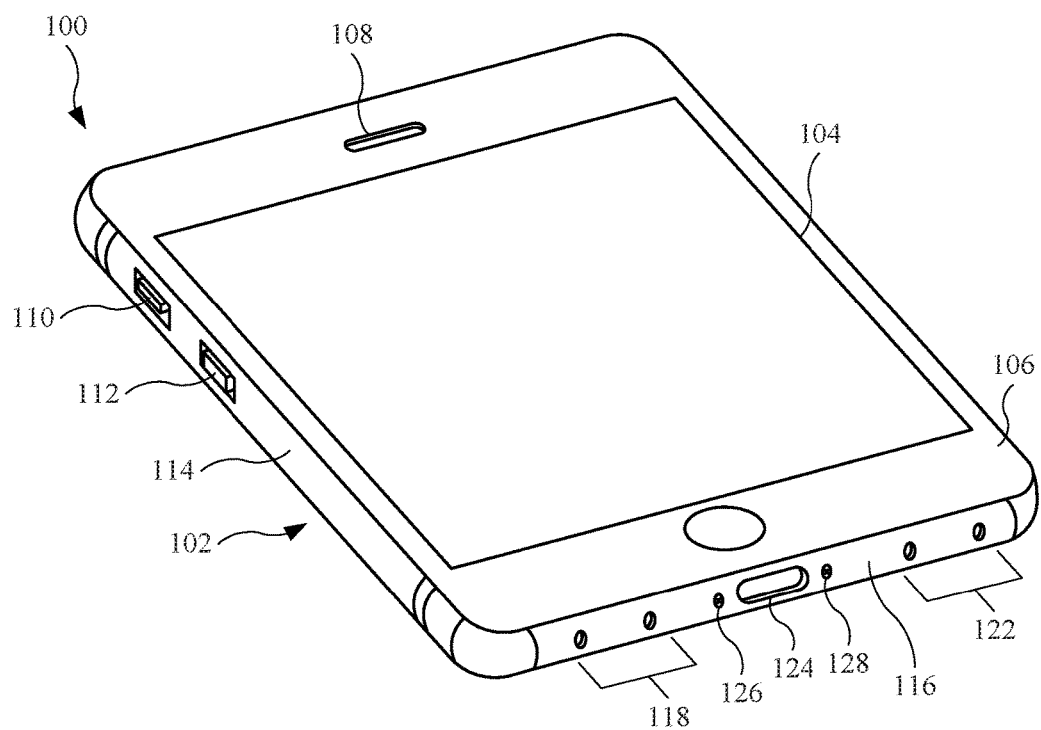
FIG. 1 illustrates a front isometric view of an embodiment of an electronic device, in accordance with some described embodiments.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to electronic devices that include several modifications designed to prevent liquid ingress into the electronic device. An electronic device described herein may include several openings, or through holes, each of which allows functionality of a component (of the electronic device) to enhance the overall performance of the electronic device. Rather than reduce the number of openings, thereby reducing the number of features, the electronic device (and some of its components) may include one or more liquid-resistant features located at or near the openings. The phrase "liquid-resistant" may apply to a material or material that is resistant to water-based solutions. The liquid-resistant features enable the electronic device to include the various components, while limiting or preventing liquid from entering the openings. As a result, damage to the electronic device that can result from liquid ingress may be prevented.

The electronic device may include an enclosure formed from metal. The enclosure may define an internal volume used as a housing for several internal components, such as a radio circuit, as a non-limiting example. In order to enable wireless communication by the radio circuit, the enclosure may include a channel (or channels) opening to the internal volume. The channel may be covered or plugged by an insert-molded material in an internal region of the enclosure and a plastic molded material on an exterior region of the enclosure, with each material allowing passage of radio frequency ("RF") transmission. In order to prevent liquid ingress through the channel and through the interface regions of the molded materials, a coating may be applied along the interior of the enclosure. The coating may cover the insert-molded material and seal the enclosure from liquid that may enter through the channel. Also, the coating may include a material that allows passing of RF transmission.

The enclosure may further include an opening for a component, such as a switch used to control a function (or functions) of the electronic device. The switch may be part of an assembly that also includes a switch body and a bracket. The switch body may include a liquid-resistant film. Further, the switch body may seal with the bracket by a sealing element, such as an O-ring or insert-molded element. Also, the bracket may seal with the enclosure at the opening (that receives the switch) by a sealing element.

Also, internal components of the electronic device may include a material (or materials) applied to liquid-sensitive components. For example, a circuit board may include integrated circuits covered by an encapsulating material that shields the integrated circuits from liquids without affecting the performance of the circuit board and its components. Further, the circuit board may include connectors designed to electrically couple the circuit board with other circuit boards and/or internal components. To shield the connectors, foam made from a liquid-resistant material may surround the connectors.

A "sealing element" as used in this detailed description may include a compliant or compressible material that is generally liquid-resistant. For example, a sealing element may include rubber or silicone. The sealing element may include a pre-fabricated ring designed to fit around a component. Alternatively, the sealing element may be molded over a component by a molding operation, such as insert molding. In this regard, the sealing element may include liquid silicone rubber.

These and other embodiments are discussed below with reference to FIGS. 1-39. However, those skilled in the art will readily appreciate that the detailed description given herein with respect to these Figures is for explanatory purposes only and should not be construed as limiting.

FIG. 1 illustrates a front isometric view of an embodiment of an electronic device 100, in accordance with some described embodiments. In some embodiments, the electronic device 100 is a laptop computer device. In other embodiments, the electronic device 100 is a wearable electronic device designed to secure with an appendage (such as a wrist) of a user of the electronic device 100. In the embodiment shown in FIG. 1, the electronic device 100 is a portable electronic device, such as a mobile wireless communication device that may take the form of, for example, a smartphone or a tablet computer device. Also, the electronic device 100 may include liquid-resistant modifications that provide the electronic device 100 with a shield from ingress into the electronic device 100. This will be described below.

The electronic device 100 may include an enclosure 102 that defines an internal volume that receives several internal components (not shown), such as a processor circuit, a memory circuit, an internal power supply, sensors, speaker modules, and a microphone, as non-limiting examples. The enclosure 102 may be formed from a metal, such as aluminum or an alloy that includes aluminum. However, other materials are possible, such as glass, rigid plastic or ceramic. Also, when the enclosure 102 is formed from a metal, the enclosure 102 may undergo an anodization process that includes immersing the enclosure 102 in an anodic bath with one or more acidic compounds. The anodization process is designed to provide an aesthetic finish to the enclosure 102 as well as improve the structural rigidity.

The electronic device 100 may further include a display assembly 104 designed to present visual information, such as text, video, or still images, to a user of the electronic device 100. Further, the display assembly 104 may include a touch-sensitive layer, including capacitive touch-sensitive technology, designed to respond to a touch input to the display assembly 104. In this regard, the display assembly 104 may respond to the touch input by changing the visual information presented on the display assembly 104. The electronic device 100 may further include a protective layer 106 that covers the display assembly 104. The protective layer 106 may include a transparent material, such as glass or sapphire. Also, the protective layer 106 may include an opening 108. When the electronic device 100 is used for voice communication, the opening 108 may define an acoustical pathway for an audio module (not shown) to transmit acoustical energy out of the electronic device 100 by way of the opening 108.

The electronic device 100 may include external controls, or input devices, that provide an input or command to an operational component (such as a processor circuit) of the electronic device 100. For example, the electronic device 100 may include an input device, such as a switch 110, electrically coupled to a processor circuit (not shown) in the electronic device 100. The switch 110 may be actuated relative to the enclosure 102 in a direction toward or away from the protective layer 106. The electronic device 100 may further include an additional input device, such as a button 112, electrically coupled to a processor circuit in the electronic device 100. The switch 110 may be actuated relative to the enclosure 102 in a direction toward the enclosure 102. In order to provide the switch 110 and the button 112, the enclosure 102 may include a first sidewall 114 having openings, with an opening used to receive the switch 110 and another opening used to receive the button 112, as shown in FIG. 1.

The electronic device 100 may further require additional openings for additional features of the electronic device 100. For example, the electronic device 100 may include a second sidewall 116. The second sidewall 116 may include openings 118 that allow airflow into and out of the electronic device 100. A vent (not shown), located in the electronic device 100, that includes an air-permeable, liquid-resistant material, may seal the openings 118. This will be shown and described below. Also, the electronic device 100 may include openings 122. A speaker module (not shown), located in the electronic device 100, may be modified to prevent liquid ingress entering the openings 122 from further ingress into the electronic device 100. This will be shown and described below. Also, the electronic device 100 may include an opening 124 and a dock (not shown) aligned with the opening 124. The dock may be used to receive a connector (not shown). In this manner, the electronic device 100 may electrically couple with an external device (not shown), by way of the dock, such that the electronic device 100 may send or receive data, as well as receive electrical power to charge in internal power supply (not shown), or battery, in the electronic device 100.

In order to secure the protective layer 106 with the enclosure 102, the electronic device 100 may include fasteners, such as a first fastener 126 and a second fastener 128, that pass through additional openings (not labeled) of the enclosure 102 and fasten into rails (not shown) that are secured with the protective layer 106. This will also be shown and described below.

Figure 2:
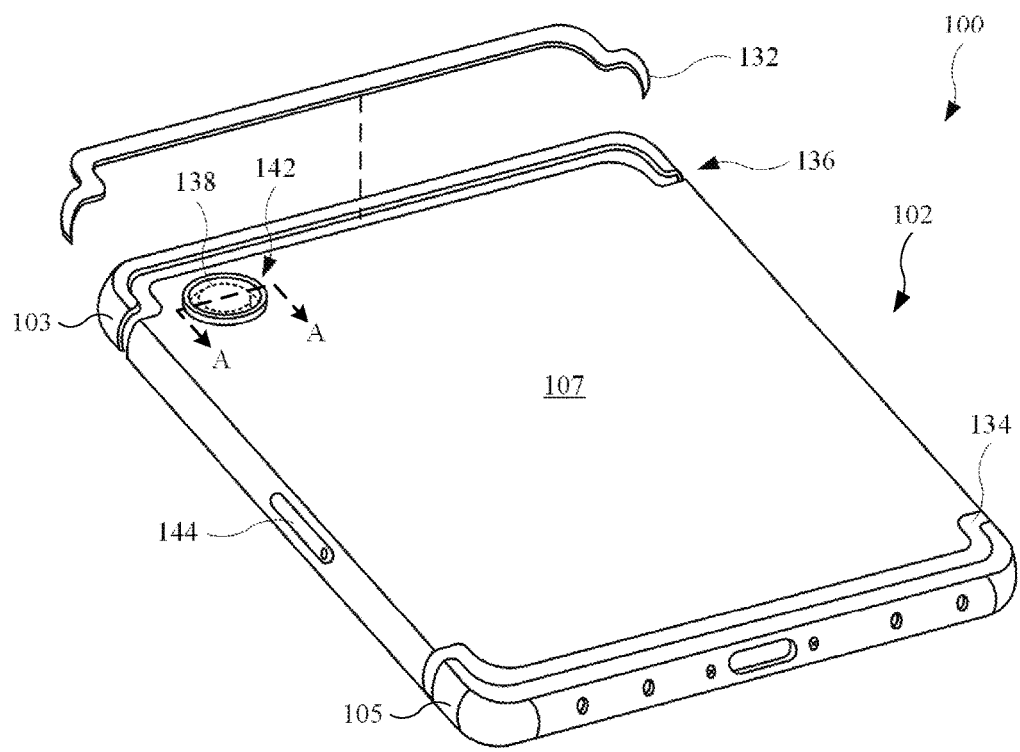
FIG. 2 illustrates a rear isometric view of the electronic device shown in FIG. 1.

FIG. 2 illustrates a rear isometric view of the electronic device 100 shown in FIG. 1. As shown, the enclosure 102 may be partitioned into multiple regions. For example, the enclosure 102 may include a first portion 103 (denoting a top portion of the enclosure 102), a second portion 105 (denoting a bottom portion of the enclosure 102), with the first portion 103 and the second portion 105 separated by a chassis 107, or base frame. In some instances, a cutting operation applied to the enclosure 102 separates a single body of metal into the first portion 103, the second portion 105, and the chassis 107. In this regard, the first portion 103, the second portion 105, and the chassis 107 may be formed from the same material(s). In some embodiments (not shown), the first portion 103 and the second portion 105 remain at least partially linked with the chassis 107, subsequent to the cutting operation. In the embodiment shown in FIG. 2, the cutting operation severs the first portion 103 and the second portion 105 from the chassis 107. Also, the first portion 103 and the second portion 105 may be used not only as protective components, but may also define part of an antenna (or multiple antennae) used by the electronic device 100. Further, the chassis 107 may be used not only as a protective component, but also as an electrical ground for internal components (not shown) that are electrically coupled to the chassis 107.

The enclosure 102 may include a first part 132 that separates the first portion 103 from the chassis 107, and a second part 134 that separates the second portion 105 from the chassis 107. In some embodiments, the first part 132 and the second part 134 are positioned in a first channel 136 and a second channel (not labeled), respectively. The channels may define partial openings in the enclosure 102 that open to the internal volume of the enclosure 102. In this regard, the channels may allow for radio frequency ("RF") communication through the enclosure 102. Accordingly, the electronic device 100 may include radio circuits (not shown), such as a Bluetooth radio circuit, cellular network circuits, and an 802.11 (Wi-Fi) protocol radio circuit, that provide the electronic device 100 with RF communication capabilities. Also, the first part 132 and the second part 134 may include an insert-molded plastic. However, other RF-passive materials (that is, materials through which RF transmission permeate or resonate) are possible. The first part 132 and the second part 134 may be used to at least partially fill the channels, with an additional material (not shown) disposed in the internal volume and engaged with the aforementioned parts. The first part 132 and second part 134 may be co-planar, or flush, with respect to the enclosure 102, and may enhance the appearance of the electronic device 100 by providing the enclosure 102 with a generally continuous or smooth finish.

The electronic device 100 may further include a camera 138 designed to capture an image external to the electronic device 100. Accordingly, the enclosure 102 may include an opening 142 that allows the camera 138 to capture an image. Also, in order to retain some account information related the user of the electronic device 100 and/or to authenticate the user, a subscriber identification module ("SIM") card (not shown) may be disposed in the electronic device 100. In this regard, the electronic device 100 may include a tray 144 designed to carry the SIM card. The tray 144 may eject from the electronic device 100 in order to insert and/or remove the SIM card.

Due in part to the various openings and channels described in FIGS. 1 and 2, the electronic device 100 may include several desirable features for a user. However, despite the openings and channels, the electronic device 100 may nonetheless include enhancements to provide a liquid-resistant device, which may prevent ingress into the electronic device 100, thereby preventing damage to one or more components of the electronic device 100. In order for the electronic device 100 to include liquid-resistant capabilities, the openings and channels should be sufficiently sealed. This will be shown and described below.

Figure 3:
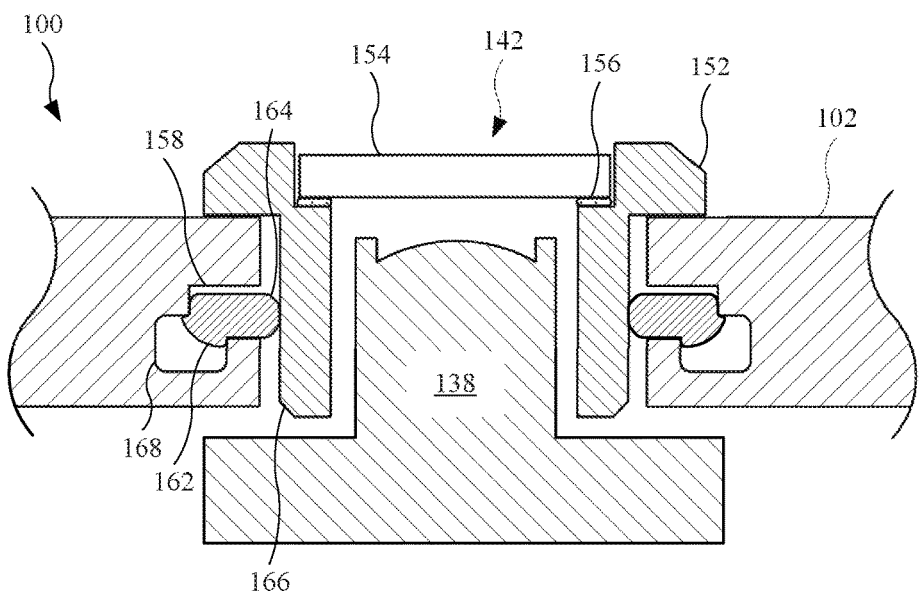
FIG. 3 illustrates a cross sectional view of the electronic device shown in FIG. 2, taken along line A-A, showing the camera aligned with the opening of the enclosure.

FIG. 3 illustrates a cross sectional view of the electronic device 100 shown in FIG. 2, taken along line A-A, showing the camera 138 aligned with the opening 142 of the enclosure 102. Some parts are removed for purposes of simplicity. As shown, the electronic device 100 includes a camera trim 152 that at least partially surrounds the camera 138. The camera trim 152 is designed to carry a protective layer 154 that provides a transparent cover for the camera 138. The protective layer 154 may be secured with the camera trim 152 by an adhesive 156. In some embodiments, the adhesive 156 includes a heat-activated film. However, other adhesives are possible. The adhesive 156 may provide a liquid-resistant bond between the camera trim 152 and the protective layer 154.

Also, the enclosure 102 may include a groove 158 formed in the enclosure 102 and extending around the opening 142. Also, as shown, the groove 158 can open to the opening 142. The groove 158 is designed to receive a sealing element 162 that engages the camera trim 152. The sealing element 162 may include a compliant, liquid-resistant seal. In some embodiments, the sealing element 162 is formed from a thermoplastic elastomer. When engaged with both the enclosure 102 and the camera trim 152, the sealing element 162 may provide a liquid-resistant barrier between the enclosure 102 and the camera trim 152, thereby preventing liquid from entering the electronic device 100 at a location between the camera trim 152 and the enclosure 102. Also, as shown, the sealing element 162 includes a chamfered region 164 designed to interface with a chamfered region 166 of the camera trim 152 during insertion of the camera trim 152 into the opening 142. In this regard, the aforementioned chamfered regions may facilitate insertion of the camera trim 152. Also, although not required, the enclosure 102 may further include a pocket 168. When compressed by the camera trim 152 and the enclosure 102, the sealing element 162 may extend into the pocket 168. Accordingly, the pocket 168 may be used as a relief section such that camera trim 152 can be inserted into the opening 142 without the sealing element 162 providing an excessive force against the camera trim 152. In other words, by receiving a portion of the sealing element 162, the pocket 168 may prevent the camera trim 152 from unwanted positioning in the enclosure 102.

Figure 4:
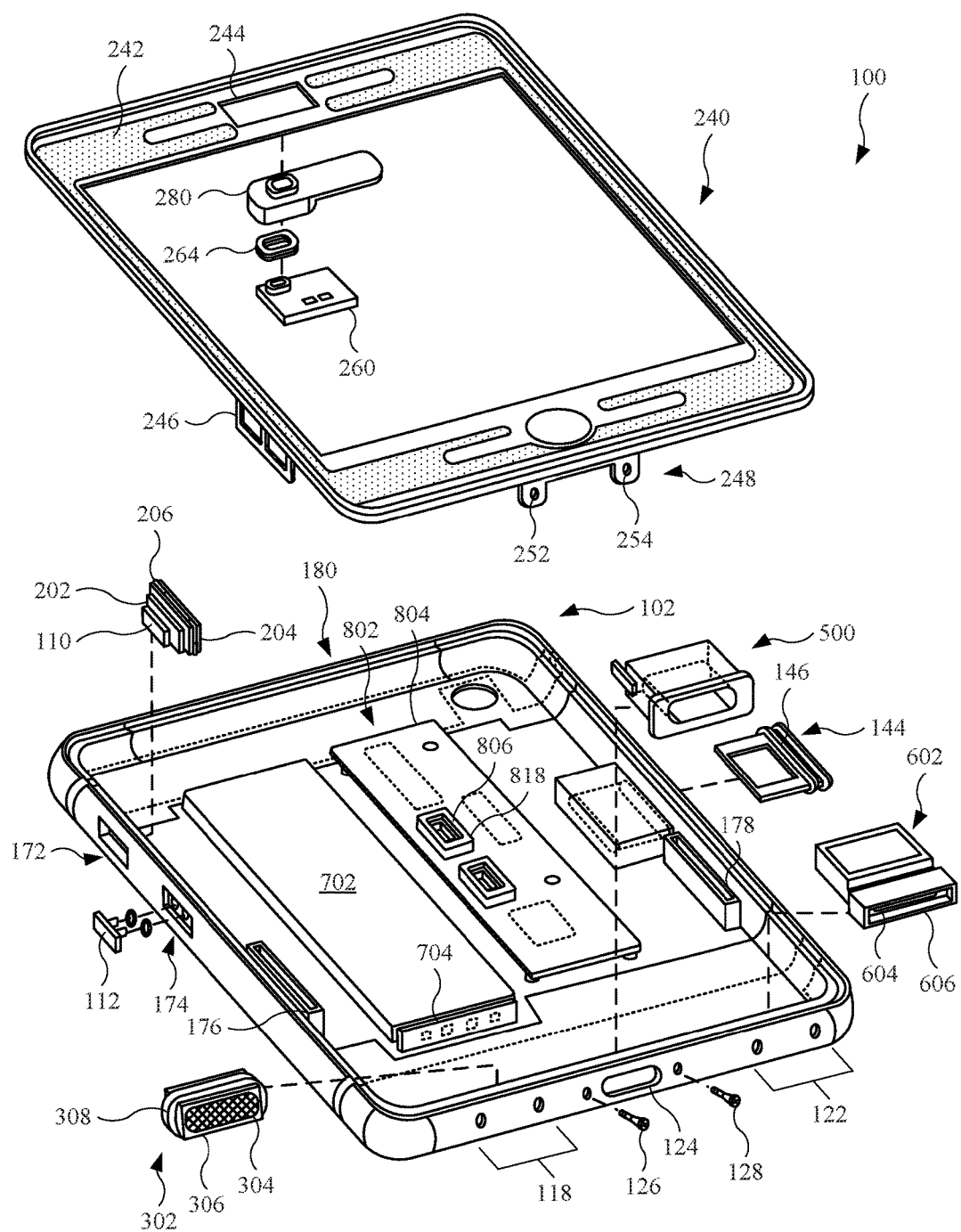
FIG. 4 illustrates an exploded view of the electronic device shown in FIGS. 1 and 2, showing various components and features of the electronic device.

FIG. 4 illustrates an exploded view of the electronic device 100 shown in FIGS. 1 and 2, showing various components and features of the electronic device 100. For purposes of illustration, the display assembly 104 and the protective layer 106 (shown in FIG. 1) are removed. As shown, the enclosure 102 may define an internal volume 180 designed to receive several internal components. Various features and components of the electronic device 100 previously described may include one or more liquid-resistant modifications designed to prevent or limit liquid ingress into the electronic device 100. The features and components described in FIG. 4 will be further described in this detailed description.

The switch 110 may include a switch body 202 that receives the switch 110. The switch body 202 may secure with a bracket 204 secured by a sealing element (not shown). Also, the switch body 202 may include a film (not shown) that provides a liquid-resistant barrier for the switch body 202. This will be shown below. Also, the bracket 204 may include a first sealing element 206 that engages an opening 172 of the enclosure 102 when the switch 110 is installed in the electronic device 100. In this manner, the switch 110 may be included in the electronic device 100, while the opening 172 is sealed to prevent liquid ingress into the electronic device 100 at the opening 172. As shown, the button 112 may include protrusions designed to enter openings 174 in the enclosure 102. The protrusions may include sealing elements that provide a liquid-resistant barrier at the openings 174.

The electronic device 100 may further include a frame 240 designed to carry the protective layer 106 (shown in FIG. 1). The frame 240 may include an adhesive 242 used to adhesively secure the aforementioned protective layer with the frame 240. The adhesive 242 may be applied in a tortuous configuration so as to avoid certain components (such as fasteners, connectors, buttons, etc.). Also, although the adhesive 242 is shown as continuously applied to the frame 240, the adhesive 242 may include breaks or discontinuities.

The electronic device 100 may further include an audio module 260 designed to convert audio signals into acoustical energy in the form of audible sound. The audio module 260 may include a sealing element 264 that secures the audio module 260 with an audio module interface 280 that extends through an opening 244 of the frame 240, allowing the audio module interface 280 to adhesively secure with the protective layer 106 (shown in FIG. 1). The sealing element 264 may include extensions designed to deform when engaged with the audio module 260 as well as the audio module interface 280, thereby providing a liquid-resistant seal between the audio module 260 and the audio module interface 280. The extensions will be shown and described in detail below.

The frame 240 may include several rails at least partially embedded in the frame 240, with the rails used to secure the frame 240 with the enclosure 102. For example, the frame 240 may include a first rail 246 that secures in a first receptacle 176 of the enclosure 102. The first rail 246 may be embedded in the frame 240, and also covered by the adhesive 242. In this manner, the adhesive 242 provides an ingress barrier in a location corresponding to the first rail 246. This will be shown below. Also, the frame 240 may include a second rail 248 that includes a first opening 252 and a second opening 254. When the frame 240 is secured with the enclosure 102, the first fastener 126 and the second fastener 128 extend through the first opening 252 and the second opening 254, respectively, with each fastener secured with an opening of the second rail 248. Also, an adhesive layer (shown later) may be used to adhesively secure the frame 240 with the enclosure 102. Although not shown, the frame 240 may include a third rail having a size and shape similar to that of the first rail 246, and designed to secure in a second receptacle 178 of the enclosure 102.

In order to allow airflow into and out of the electronic device 100, the electronic device 100 may include a vent 302. The vent 302 may include a membrane 304 that is air-permeable, but liquid resistant. In this manner, when the vent 302 secured in the enclosure 102 and against the openings 118, air may enter or exit the enclosure 102 via the openings 118 and the vent 302, while the membrane 304 prevents liquid passage into the electronic device 100. Also, the vent 302 may include a bracket 306 and a sealing element 308 secured over the bracket 306. The sealing element 308 may be molded onto the bracket 306 by an insert molding operation. The sealing element 308 may include silicone, or another compliant, liquid-resistant material. Also, the sealing element 308 may engage the enclosure 102 to provide an ingress barrier between the bracket 306 and the enclosure 102. This will be shown below.

In order to seal the openings that receive the first fastener 126 and the second fastener 128, the first fastener 126 and the second fastener 128 may be coated with polymeric material that is sprayed or otherwise deposited thereon. The polymeric material may include polyurethane, as a non-limiting example. As shown, the first fastener 126 includes a coating (not labeled) and the second fastener 128 includes a coating (not labeled). The aforementioned coatings may compress or conform to the openings that receive the first fastener 126 and the second fastener 128, thereby sealing those openings from liquid ingress.

The electronic device 100 may further include a dock assembly 500 that aligns with the opening 124 when installed in the internal volume 180. The dock assembly 500 may include several terminals designed to electrically couple the electronic device 100 with an external device (not shown). As a result of the terminals, the dock assembly 500 may include several openings. However, the dock assembly 500 may be sealed such that liquid ingress entering the dock assembly 500 is prevented or limited from further ingress into the internal volume 180. This will be shown below.

The electronic device 100 may further include a speaker module 602 that aligns with the openings 122 when installed in the internal volume 180. The speaker module 602 may include a speaker opening 604 that allows acoustical energy generated by the speaker module 602 to exit the speaker module 602. Despite the speaker opening 604, the speaker module 602 may include several internal modifications such that any liquid entering the speaker opening 604 (by way of the openings 122) does not cause damage to the speaker module 602. Also, the speaker module 602 may include a bracket 606 secured with the speaker module 602 by a sealing element (shown and described below).

As previously described, the tray 144 is designed to carry the SIM card, and may eject from the electronic device 100 for insertion and/or removal of the SIM card. The tray 144 may include a sealing element 146 designed to fold or collapse when compressed between the tray 144 and the enclosure 102. This will be shown below.

In addition to the electronic device 100 having several liquid-resistant modifications to exterior regions, the electronic device 100 may include additional modifications to centrally located components. For example, the electronic device 100 may include an internal power supply 702 and a circuit board 704 electrically coupled with the internal power supply 702. An encapsulating material may cover the circuit board 704, as well as several components (shown as dotted lines) on the circuit board 704, thereby forming a liquid-ingress barrier that prevents corrosion and short-circuiting, due to liquid, of the aforementioned components. Alternatively, the circuit board 704 may be covered by a tape or spray.

Also, the electronic device 100 may include main circuit board 802, or "motherboard," that is in communication with several electrical components in the electronic device 100. The main circuit board 802, along with components (shown as dotted lines) on the main circuit board 802, may be encapsulated with an encapsulating material 804. The encapsulating material 804 may include a hydrophobic coating designed resist water that would otherwise contact the main circuit board 802 and its components. The encapsulating material 804 may be applied by a vapor deposition operation. Also, the main circuit board 802 may include connectors used to electrically couple the main circuit board 802 with other circuit boards (not shown) or other components. For example, the main circuit board 802 may include a first connector 806 uncovered by the encapsulating material 804, and surround by a first sealing element 818 formed from a liquid-resistant material, such as a closed-cell foam. This will be further shown and described below.

Figure 5:
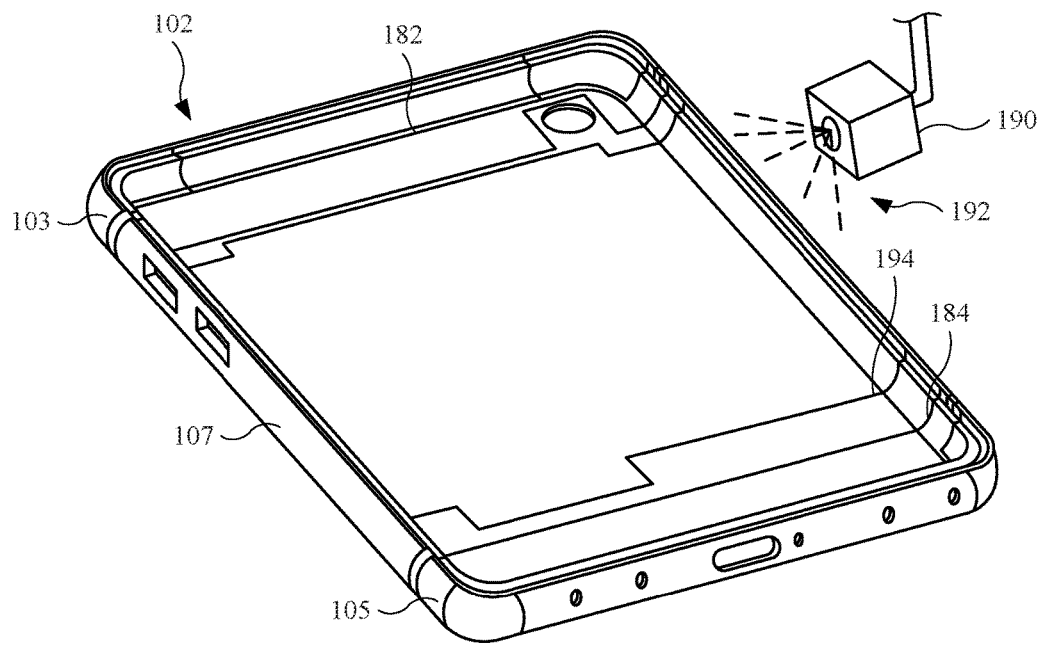
FIG. 5 illustrates an isometric view of the enclosure undergoing a coating operation.

FIG. 5 illustrates an isometric view of the enclosure 102 undergoing a coating operation. As shown, the enclosure 102 may further include a first layer 182 and a second layer 184 disposed in the internal volume 180, and positioned in locations corresponding to the first part 132 and the second part 134 (shown in FIG. 2), respectively. The first layer 182 and the second layer 184 may provide a rigid layer in locations generally void of the enclosure materials, such as between the first portion 103 and the chassis 107, and between the second portion 105 and the chassis 107. In order to apply the first layer 182 and the second layer 184, a molding operation (including an insert molding operation) to the enclosure 102 may be used. Accordingly, the first layer 182 and the second layer 184 may be referred to as a first insert molded layer and a second insert molded layer, respectively. The first layer 182 and the second layer 184 may include a rigid, non-metal material(s) that provides structural support to the enclosure 102, particularly in locations of the channels that receive the first part 132 and the second part 134. Moreover, the first layer 182 and the second layer 184 may include RF-permissive materials that permit transmission of RF communication. In other words, the first part 132 and the first layer 182 may form a first RF window for an electronic device (such as the electronic device 100, shown in FIG. 1), and the second part 134 and the second layer 184 may form a second RF window for the electronic device.

The coating tool 190 may apply a spray coating 192 that includes a polymeric material, such as polyurethane, as a non-limiting example. However, other materials, such as UV-cured glues or other sealing materials may be used. The spray coating 192 is designed to cover the first layer 182 and the second layer 184, particularly in locations corresponding to the first part 132 and the second part 134 (shown in FIG. 2). In this manner, the spray coating 192 may seal the enclosure 102 and prevent liquid ingress entering the channels (not shown) located in areas corresponding to the first part 132 and the second part 134. Once the spray coating 192 is applied to the enclosure 102, the spray coating 192 is cured by a heating operation. Also, in some instances, the enclosure 102 includes a mask 194 used to prevent the spray coating 192 from contacting certain predetermined locations of the enclosure 102, such as locations in which some internal components are secured or fastened with the enclosure 102. The mask 194 may be removed subsequent to the coating operation. While a particular shape of the mask 194 is shown, other shapes are possible.

In some instances, air may become trapped at an interface between two or more parts. As the air passes through the spray coating 192, the air may cause bubbling. In order to reduce bubbling of the spray coating 192, the spray coating 192 may include a thinner material, or other solvent, to thin the spray coating 192. Also, the heating/curing operations may be altered to promote movement of any bubbles out of the spray coating 192 once the spray coating is applied to the enclosure 102. For example, the heat applied to the spray coating 192 during a curing operation coupled with decreased heating time may, along with the thinner, reduce the bubbling of the spray coating 192. In addition, a vacuum can be used to remove the air and/or pull the spray coating 192.

Figure 6:
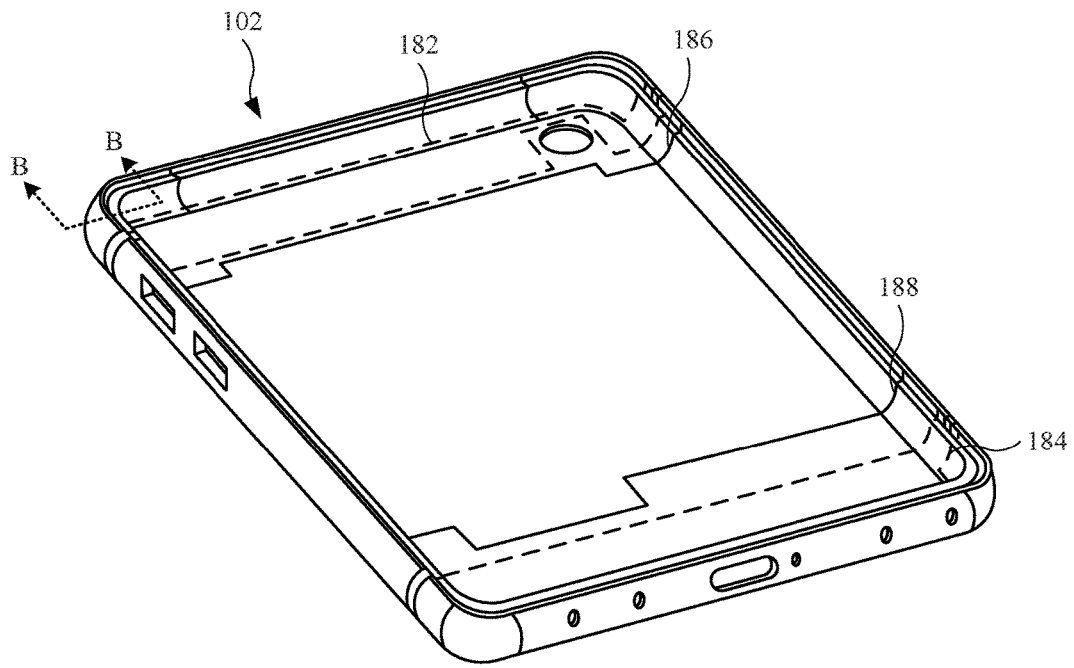
FIG. 6 illustrates the enclosure shown in FIG. 5, subsequent to the coating operation and removal of the mask.

FIG. 6 illustrates the enclosure 102 shown in FIG. 5, subsequent to the coating operation and removal of the mask 194. Subsequent to the removal of the mask 194, FIG. 6 shows a first coating 186 and a second coating 188 covering the first layer 182 and the second layer 184, respectively. The first coating 186 and the second coating 188 remain to provide an ingress barrier to liquids that may pass through the aforementioned channels that receive the first part 132 and the second part 134 (shown in FIG. 2). Also, when the mask 194 is removed the enclosure 102, the chassis 107 includes a region or regions in which the first coating 186 and the second coating 188 are not present. The region(s) of the enclosure 102 that does not include the first coating 186 or the second coating 188 can be used not only as a platform to which internal components are secured, but also as an electrically conductive region (as the enclosure 102 can be formed from a metal) that provides an electrical grounding pathway.

Also, while a spraying operation is shown and described in FIGS. 5 and 6, additional processes may be used to apply a coating. For example, the first coating 186 and the second coating 188 may be applied by manual means, including brushing or applying a coating material to a small surface. These manual means may be complementary to the spraying operation, in order to ensure coating material is applied to corner regions or other complex, non-planar geometries. Also, in order to alter the amount of spray coating 192 (shown in FIG. 5) dispensed and/or the amount of pressure applied to the spray coating 192, the coating tool 190 may include a nozzle such that the spray coating 192 may be dispensed through the nozzle.

Figure 7:
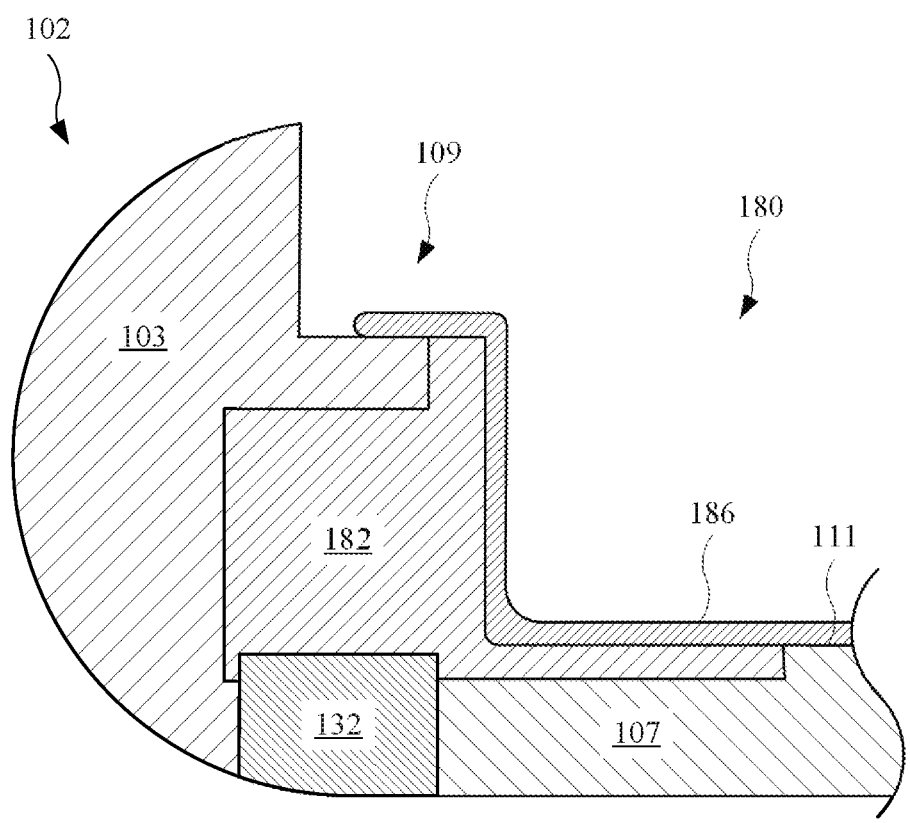
FIG. 7 illustrates a cross sectional view of the enclosure shown in FIG. 6, taken along line B-B, showing the first coating disposed along the first layer and the enclosure.

FIG. 7 illustrates a cross sectional view of the enclosure 102 shown in FIG. 6, taken along line B-B, showing the first coating 186 disposed along the chassis 107, the first layer 182 and the first portion 103. As shown, the first coating 186 substantially covers the first layer 182 such that any liquid ingress that passing through the first part 132 and the first layer 182 may be limited or prevented from passing into the internal volume 180. Also, the first coating 186 may substantially cover a platform 109 that defines a receiving surface for the frame 240 (shown in FIG. 4). The platform 109 may be formed in part by the first portion 103 and the first layer 182. Also, the first portion 103 and the first layer 182 may interface each other such that the first coating 186 may cover the first portion 103 and the first layer 182 along a horizontal plane (parallel, or at least substantially parallel, to the chassis 107). In this manner, any forces (such as gravitational forces) acting on the first coating 186 do not cause the first coating 186 to "drain" or fall onto the chassis 107. In other words, the horizontal plane promotes the first coating 186 remaining on the platform 109. Although not shown, in other locations, the second portion 105 may combine with the second layer 184 to form an additional part of the platform 109 in a similar manner as that shown in FIG. 7.

Also, as shown in FIG. 7, the chassis 107 may include an extension 111 used as a levee, or embankment, that prevents the first layer 182 from creeping or otherwise extending to unwanted locations of the chassis 107. Also, the extension 111 may provide an additional horizontal interface, similar to above, between the first layer 182 and the chassis 107, thereby promoting a stagnation or fixation of the first coating 186. Also, it should be noted that the material used for the first coating 186 includes RF-permissive materials so as to provide little, if any, interference with RF communication.

Figure 8:
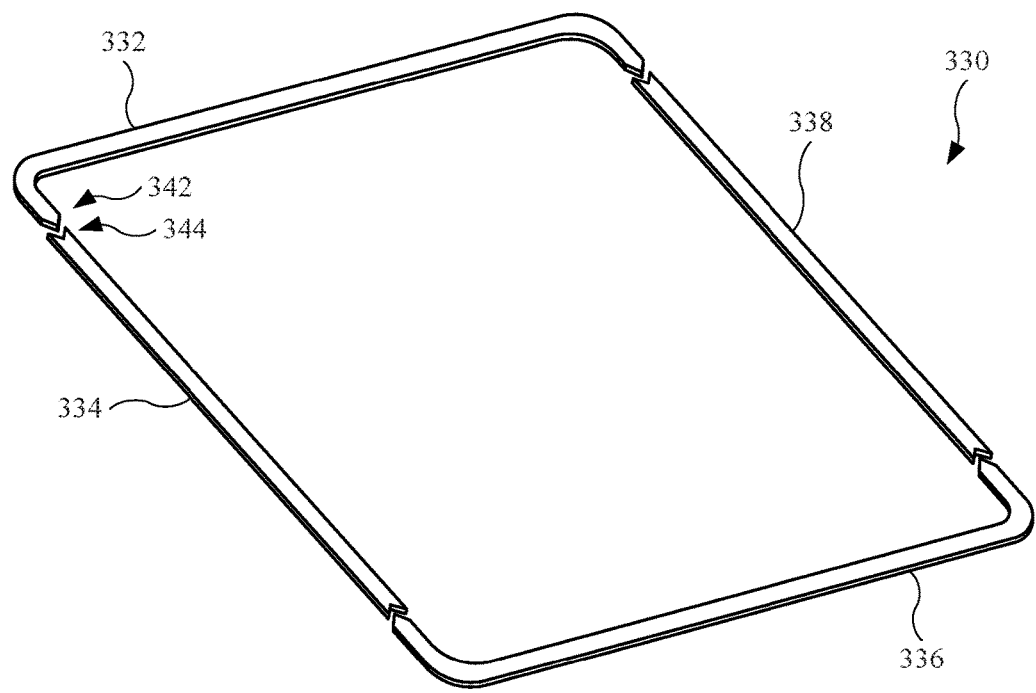
FIG. 8 illustrates an isometric view of an adhesive assembly that secures the frame with the enclosure, showing the adhesive assembly divided into multiple sections.

Additional sealing means may be provided to the enclosure 102 that combines with the coatings. For example, FIG. 8 illustrates an isometric view of an adhesive assembly 330 that secures the frame 240 with the enclosure 102 (both of which are not shown), showing the adhesive assembly 330 divided into multiple sections. For example, the adhesive assembly 330 may include a first adhesive part 332, a second adhesive part 334, a third adhesive part 336, and a fourth adhesive part 338. Dividing the adhesive assembly 330 into multiple sections may facilitate applying the adhesive assembly 330 to the enclosure 102. This may reduce the manufacturing time, and associated costs, of assembling the adhesive assembly 330 with the enclosure 102 (shown in FIG. 4). Also, while a discrete number of sections are shown, a different number of sections is possible. Also, each adhesive part is designed to mate with an adjacent section. As shown, each adhesive part may include "V" configuration. For example, the first adhesive part 332 includes a protruding section 342 that extends into a recessed section 344 of the second adhesive part 334. The protruding section 342 may include a protruding V-shaped section, and the recessed section 344 may include a recessed V-shaped section having a shape corresponding to that of the protruding section 342. Although the adhesive parts may be separated when applied to the enclosure 102 (shown in FIG. 4), when the frame 240 is secured with the enclosure 102, the compressive forces between the frame 240 (shown in FIG. 4) and the enclosure 102 may cause the adhesive parts to expand and engage other adhesive parts at their respective V-sections. This will be shown and described below.

Figure 9:
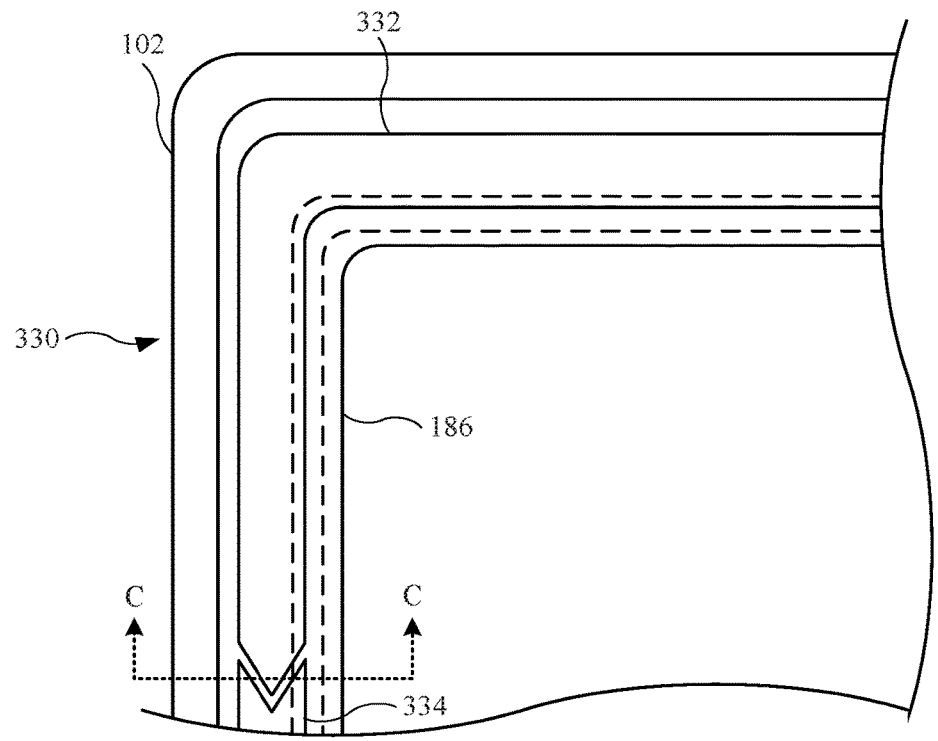
FIG. 9 illustrates a partial plan view of the adhesive assembly (shown in FIG. 8) positioned on the enclosure, further showing the adhesive assembly disposed on the enclosure and the first coating.

FIG. 9 illustrates a partial plan view of the adhesive assembly 330 positioned on the enclosure 102, further showing the adhesive assembly 330 disposed on the enclosure 102 and the first coating 186. In some instances, the adhesive assembly 330 is also disposed on the first layer 182 (shown in FIG. 5). As shown, the first adhesive part 332 and the second adhesive part 334 may at least partially cover the first coating 186 such that the adhesive parts combine with the first coating 186 to provide an ingress barrier. Although not shown, the remaining adhesive parts may at least partially cover the second coating 188 (shown in FIG. 6) in a similar manner.

Figure 10:
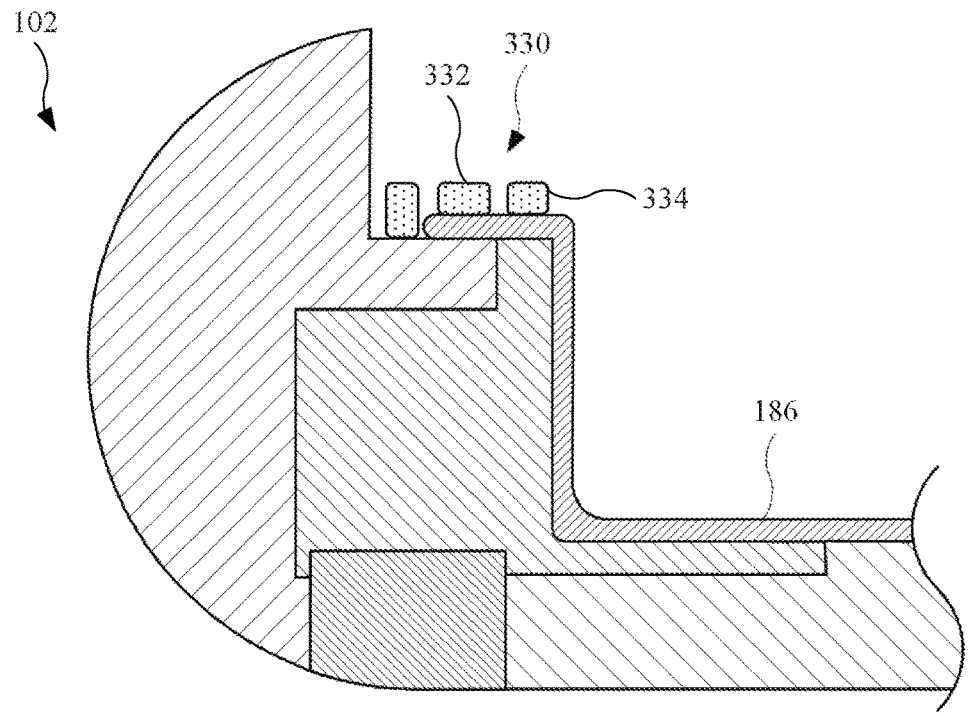
FIG. 10 illustrates a cross sectional view of the enclosure shown in FIG. 9, taken along line C-C, showing the adhesive parts positioned on the enclosure and the first coating.
Figure 11:
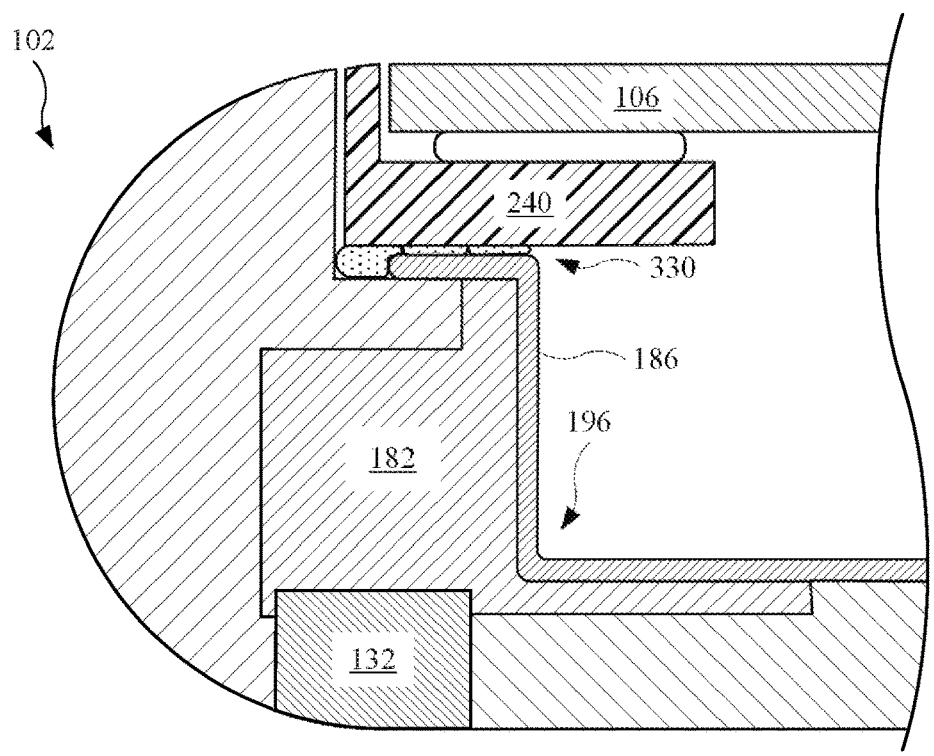
FIG. 11 illustrates a cross sectional view of the enclosure shown in FIG. 10, further showing the protective layer and the frame secured with the enclosure via the adhesive assembly.

FIG. 10 illustrates a cross sectional view of the enclosure 102 shown in FIG. 9, taken along line C-C, showing the adhesive assembly 330 positioned on the enclosure 102 and the first coating 186. As shown, the first adhesive part 332 is separated from the second adhesive part 334. However, the adhesive parts may compress, causing the adhesive parts bond with one another. For example, FIG. 11 illustrates a cross sectional view of the enclosure 102 shown in FIG. 10, further showing the protective layer 106 and the frame 240 secured with the enclosure 102 via the adhesive assembly 330. As shown, the compression forces provided by the frame 240 and/or the enclosure 102 cause the adhesive parts of the adhesive assembly 330 to expand and engage one another. In this regard, the adhesive assembly 330 may combine with the first coating 186 (and also the second coating 188, not shown) to further provide an ingress barrier against liquids that may attempt to enter between the frame 240 and the enclosure 102.

Also, in some instances, prior to securing the protective layer 106 and the frame 240 with the enclosure 102, the coatings may undergo a cutting operation to reduce the space occupied by the coating. For example, as shown in FIG. 11, the first coating 186 may be cut along a corner region 196 such that the amount of material defining the first coating 186 is reduced at the corner region 196. The cutting operation may include a milling operation or a computer numeric control ("CNC") cutting operation.

Figure 12:
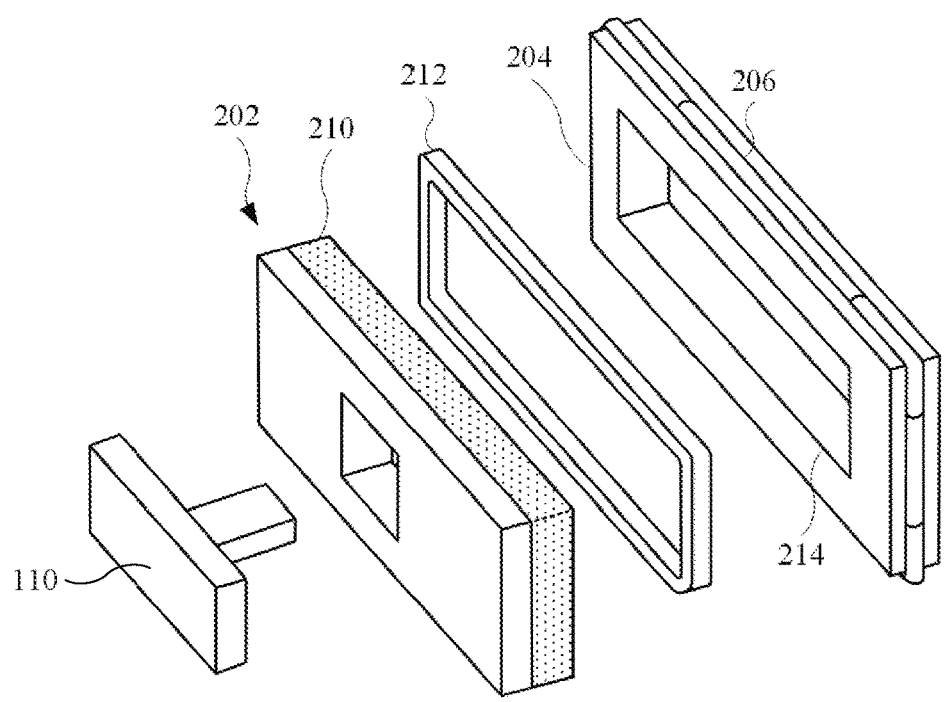
FIG. 12 illustrates an exploded view of a switch assembly that includes the switch, as well as several additional components that assemble with the switch.

FIG. 12 illustrates an exploded view of a switch assembly that includes the switch 110, as well as several additional components that assemble with the switch 110. The switch 110 may be connected to a switch body 202 that allows the switch 110 to actuate relative to the switch body 202. The switch body 202 may include a film 210 disposed on the switch body 202. The film 210 may include a liquid-resistant material. In some embodiments, the film 210 includes a nylon film. Also, as shown, the first sealing element 206 may be positioned on an outer perimeter of the bracket 204. The first sealing element 206 may include a compliant, liquid-resist material that conforms in response to compressive forces. The switch body 202 may secure with the bracket 204 by a second sealing element 212, which may include a compliant seal or gasket. Also, the bracket 204 may include an opening 214 that allows a circuit (not shown) to electrically couple with the switch 110.

Figure 13:
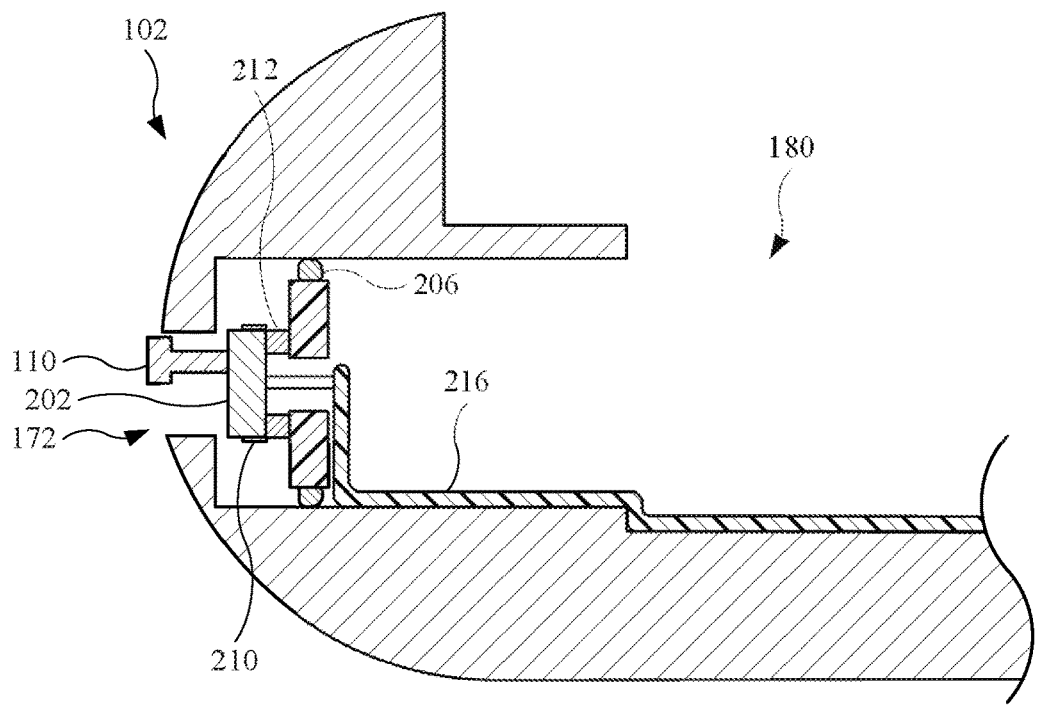
FIG. 13 illustrates a cross sectional view of the switch and various components shown in FIG. 12, showing the switch and components positioned in the enclosure.

FIG. 13 illustrates a cross sectional view of the switch and various components shown in FIG. 12, showing the switch 110 and components positioned in the enclosure 102. As shown, when the switch 110 and associated components are positioned in the opening 172, the first sealing element 206 seals with the enclosure 102 to prevent liquid ingress entering the opening 172 and passing into the internal volume 180. Further, the second sealing element 212 may prevent liquid ingress passing through the opening 172 from contacting an electrical connection point between the switch body 202 and a circuit 216 electrically coupled to the switch body 202. Also, the film 210 further protects the switch body 202 from liquid ingress. Accordingly, the enclosure 102 may be sealed at the opening 172 from liquid ingress.

Figure 14:
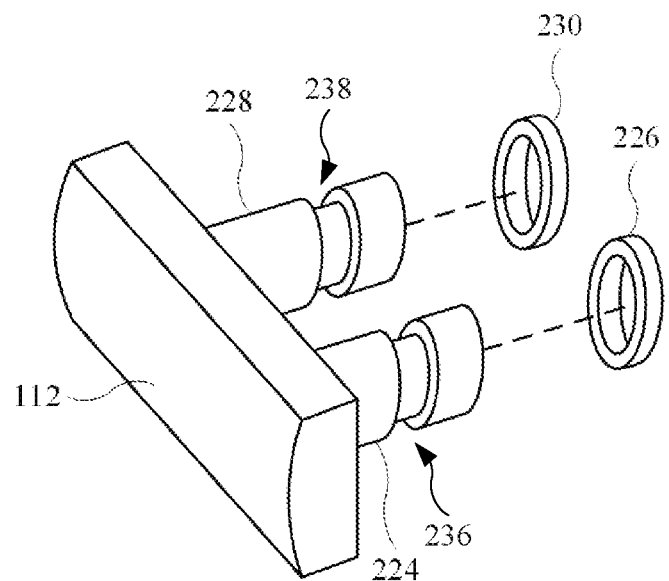
FIG. 14 illustrates an exploded view of the button and several sealing elements.

FIG. 14 illustrates an exploded view of the button 112 and several sealing elements. As shown, the button 112 may include a first protrusion 224 that receives a first sealing element 226 and a second protrusion 228 that receives a second sealing element 230. The first sealing element 226 and the second sealing element 230 may include a compliant, liquid-resist material that conforms in response to compressive forces. Also, the first sealing element 226 and the second sealing element 230 may stretch to fit onto grooved regions of the first protrusion 224 and the second protrusion 228, respectively. For example, the first protrusion 224 includes a first grooved region 236 for the first sealing element 226, and the second protrusion 228 includes a second grooved region 238 for the second sealing element 230.

Figure 15:
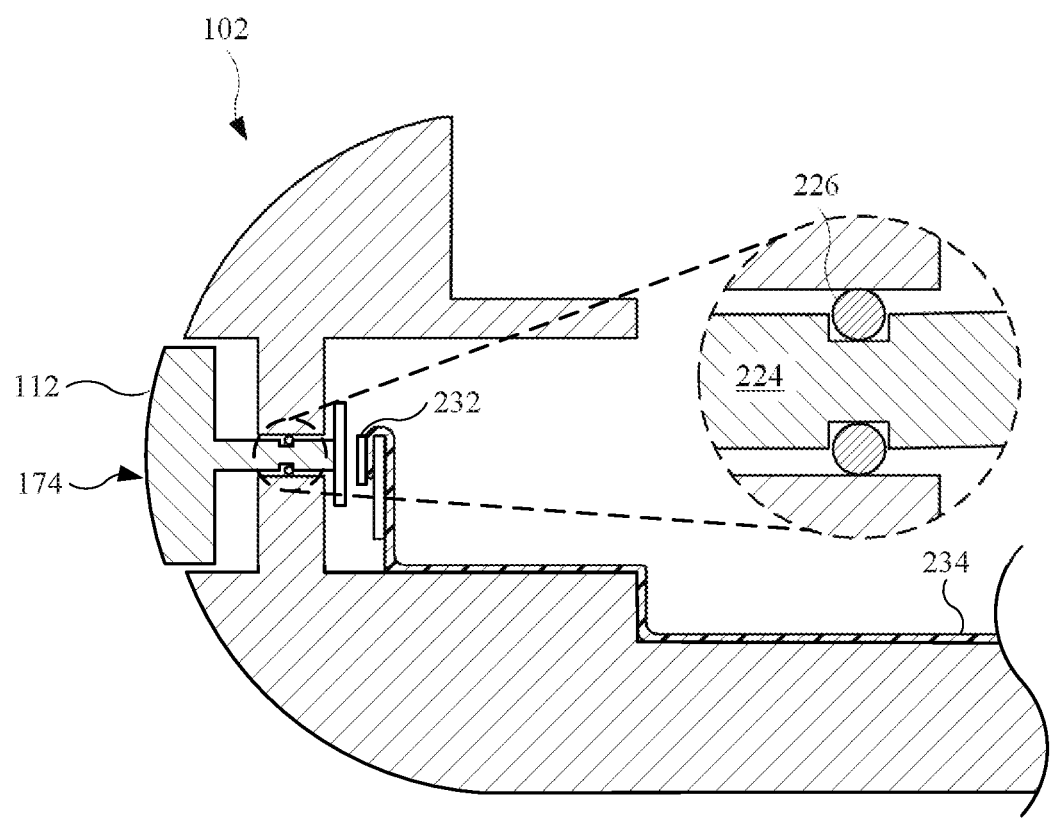
FIG. 15 illustrates a cross sectional view of the button and the sealing elements shown in FIG. 14, showing the components positioned in the enclosure.

FIG. 15 illustrates a cross sectional view of the button 112 and the sealing elements shown in FIG. 14, showing the components positioned in the enclosure 102. When positioned in the openings 174, the sealing elements may engage the enclosure 102 to form a liquid barrier between the button 112 and the enclosure 102 to prevent liquid from entering the internal volume 180. For example, as shown in the enlarged view, the first sealing element 226 may compress against the first protrusion 224 and the enclosure 102. The second sealing element 230 (labeled in FIG. 14) may be positioned and compressed in a manner similar to that of the first sealing element 226. Accordingly, the enclosure 102 may be sealed from liquid ingress at the openings 174. Also, when the button 112 is depressed, the first protrusion 224 slides through the opening of the enclosure 102 and engages a switch mechanism 232 (which may include a tactile switch) to close the switch mechanism 232, thereby sending an electrical signal along a circuit 234 electrically coupled to the switch mechanism 232. However, the first sealing element 226 moves in conjunction with the first protrusion 224 and remains positioned against an internal surface of one of the openings 174 to provide the liquid ingress barrier. It should also be noted that the second protrusion 228 moves in a manner similar to that of the first protrusion 224 to engage the switch mechanism 232, and the second sealing element 230 moves in conjunction with the second protrusion 228 while remaining positioned against an internal surface of the remaining one of the openings 174 to provide the liquid ingress barrier.

Figure 16:
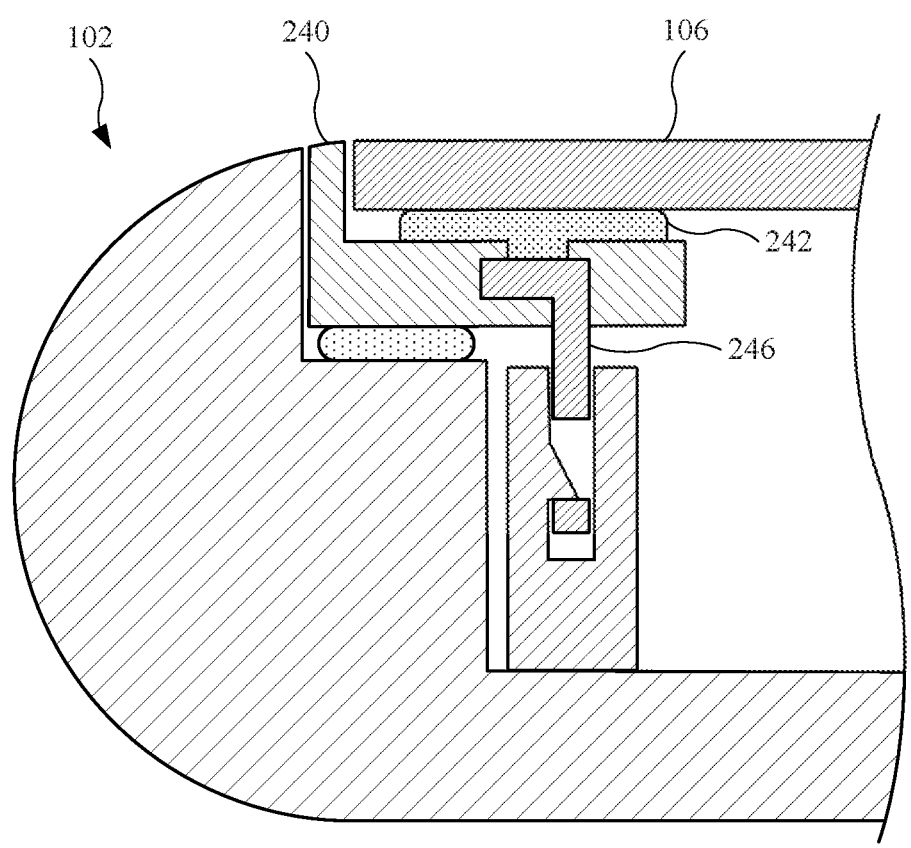
FIG. 16 illustrates a cross sectional view of the enclosure, showing the first rail embedded in the frame and covered by the adhesive.

FIG. 16 illustrates a cross sectional view of the enclosure 102, showing the first rail 246 embedded in the frame 240 and covered by the adhesive 242. As shown, the adhesive 242 covers the first rail 246 in a manner such that any liquid ingress entering between the frame 240 and the protective layer 106 may be prevented from further liquid ingress, due in part to the adhesive 242. In particular, the adhesive 242 may prevent advancement of liquid ingress in locations associated with the first rail 246.

Figure 17:
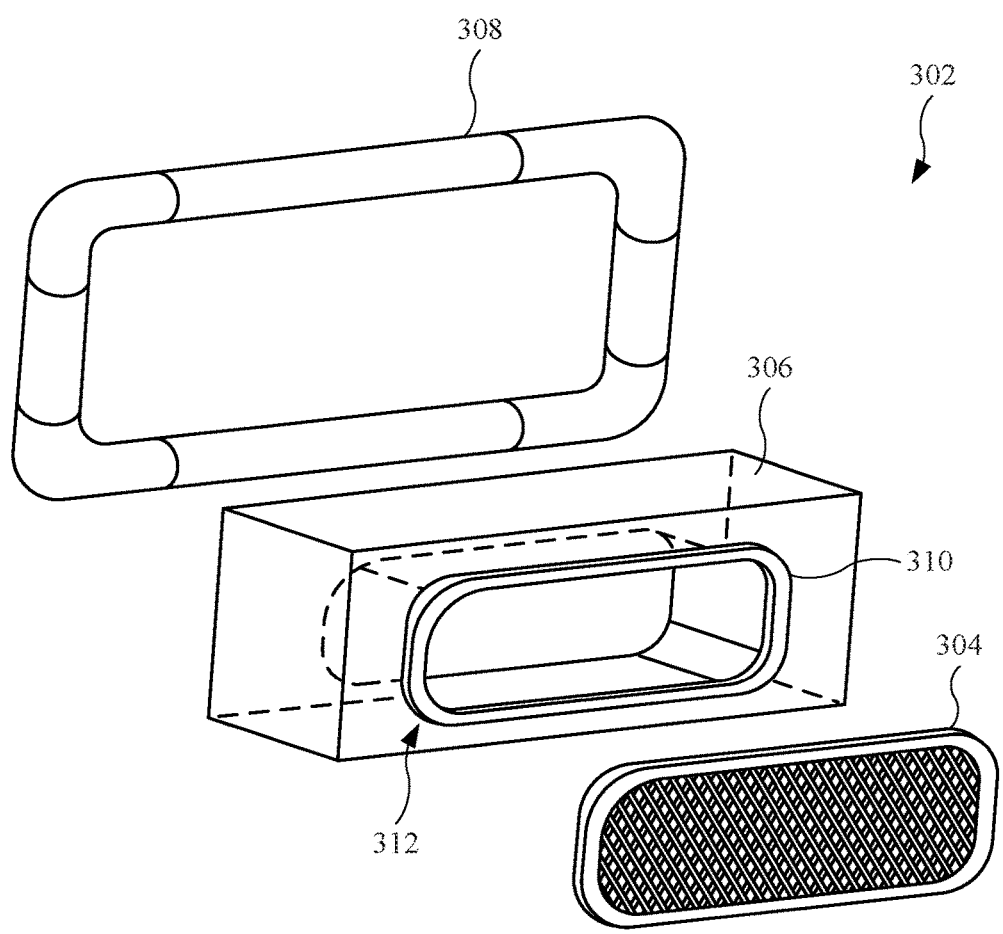
FIG. 17 illustrates an exploded view showing the vent and various components used with the vent.

FIG. 17 illustrates an exploded view showing the vent 302 and various components used with the vent 302. For example, the membrane 304 may include an air-permeable, water-resistant material that allows air, but not liquid, to pass through the vent 302. The membrane 304 may be secured with the bracket 306 by an adhesive 310. However, other methods may be used to secure the membrane 304 with the bracket 306. For example, the membrane 304 may be ultrasonically welded to the bracket 306. Alternatively, the membrane 304 may be molded into the bracket 306 by an insert molding operation. Also, the vent 302 may further include a sealing element 308 secured with an outer perimeter of the bracket 306. The sealing element 308 may include a compliant, liquid-resist material that conforms in response to compressive forces. Also, the sealing element 308 may be molded to the bracket 306 by an insert molding operation. However, other methods described for securing the membrane 304 with the bracket 306 may be used to secure the sealing element 308 with the bracket 306. Also, as shown, the bracket 306 may include an opening 312 to allow air to pass through the bracket 306 via the opening 312.

Figure 18:
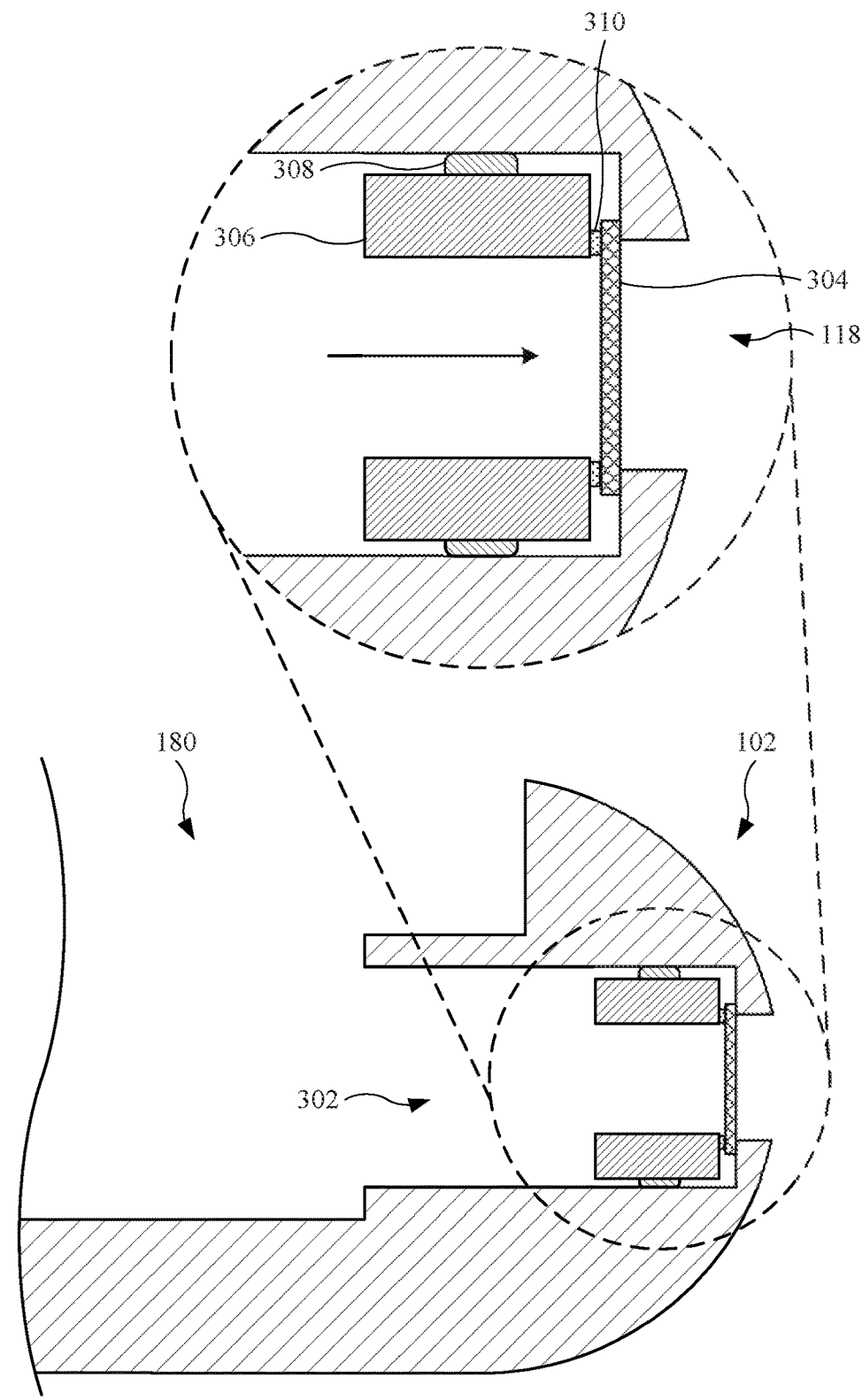
FIG. 18 illustrates a cross sectional view of the vent shown in FIG. 17, showing the vent positioned in the enclosure.

FIG. 18 illustrates a cross sectional view of the vent 302 shown in FIG. 17, showing the vent 302 positioned in the enclosure 102. As shown in the enlarged view, the sealing element 308 may compress against the bracket 306 and the enclosure 102 to form an ingress barrier that prevents liquid that enters the openings 118 (both of which are shown in FIG. 4) from further passing into the internal volume 180. In this manner, the membrane 304 is positioned at the openings 118 to allow air, but not liquid, into or out of the internal volume 180. This may allow the electronic device 100 (shown in FIG. 1) to equilibrate and adjust to a change in external pressure.

Also, the vent 302 may undergo an assembly test to ensure the membrane 304 is properly secured with the bracket 306. In particular, the assembly test may determine whether the adhesive 310 properly seals the membrane 304 with the bracket 306, and/or whether the sealing element 308 properly seals the bracket 306 with the enclosure 102. For example, a polyethylene terephthalate ("PET") material (not shown) may engage the membrane 304 and seal the openings 118. Then a negative pressure, or vacuum, may be applied within the internal volume 180, and the air leak rate around the adhesive 310 and sealing element 308 is determined and compared with a threshold air leak rate to ensure a desired seal is achieved.

Figure 19:
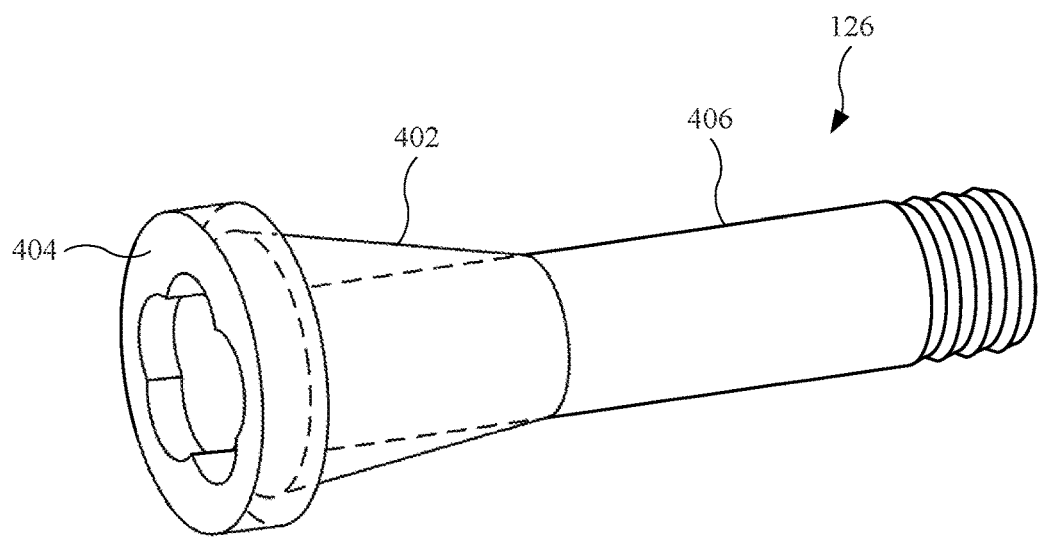
FIG. 19 illustrates an isometric view of the first fastener and a coating disposed on the first fastener.

FIG. 19 illustrates an isometric view of the first fastener 126 and a sealing element 402 disposed on the first fastener 126. As shown, the first fastener 126 may include a head 404 and a shaft 406. The shaft 406 can receive a tool (not shown) to rotationally drive the shaft 406 into an object, such as the second rail 248 (shown in FIG. 4). Also, the shaft 406 may provide a threaded engagement with the object. The sealing element 402 may include a polymeric material, such as polyurethane, deposited on the shaft 406 and under the head 404. Alternatively, the sealing element 402 may be replaced by an O-ring. The sealing element 402 may include a compliant, liquid-resistant material that compresses in response to some forces. Also, although the first fastener 126 is shown, the second fastener 128 (shown in FIG. 4) may include any feature or features previously described for the first fastener 126.

Figure 20:
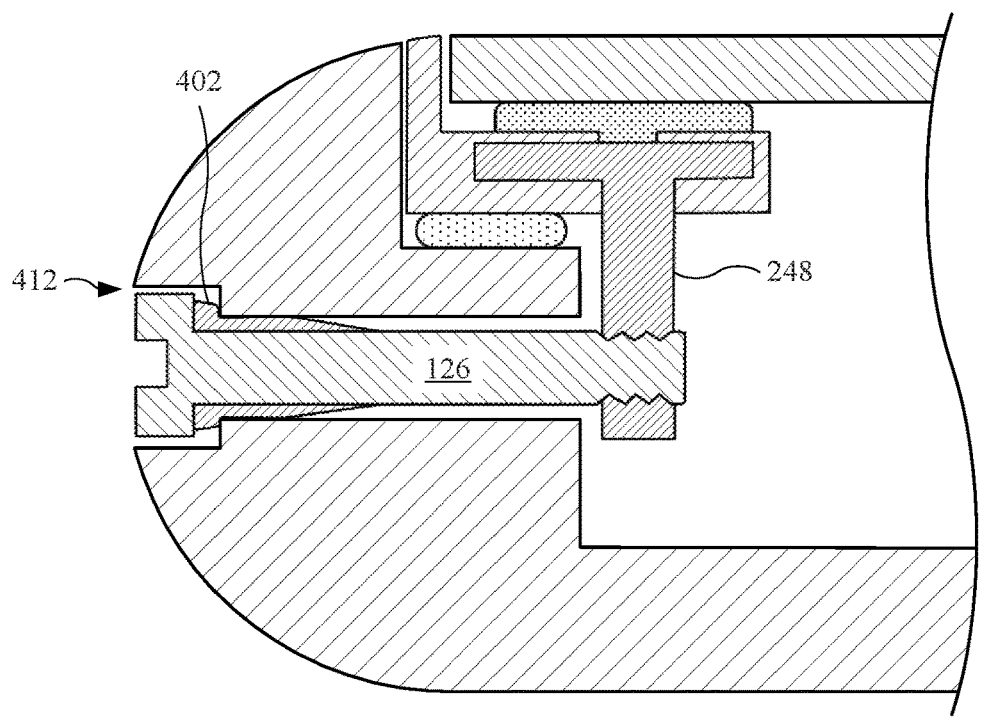
FIG. 20 illustrates a cross sectional view of the first fastener shown in FIG. 19, showing the first fastener inserted into the enclosure and secured with the second rail.

FIG. 20 illustrates a cross sectional view of the first fastener 126 shown in FIG. 19, showing the first fastener 126 inserted into the enclosure 102 and secured with the second rail 248. As shown, when the first fastener 126 is inserted into an opening 412 of the enclosure 102 and in threaded engagement with the second rail 248, the sealing element 402 may compress between the enclosure 102 and the first fastener 126, thereby forming an ingress barrier at the opening 412. It will be appreciated that the second fastener 128 (shown in FIG. 4) may achieve similar results when inserted into the enclosure 102.

Figure 21:
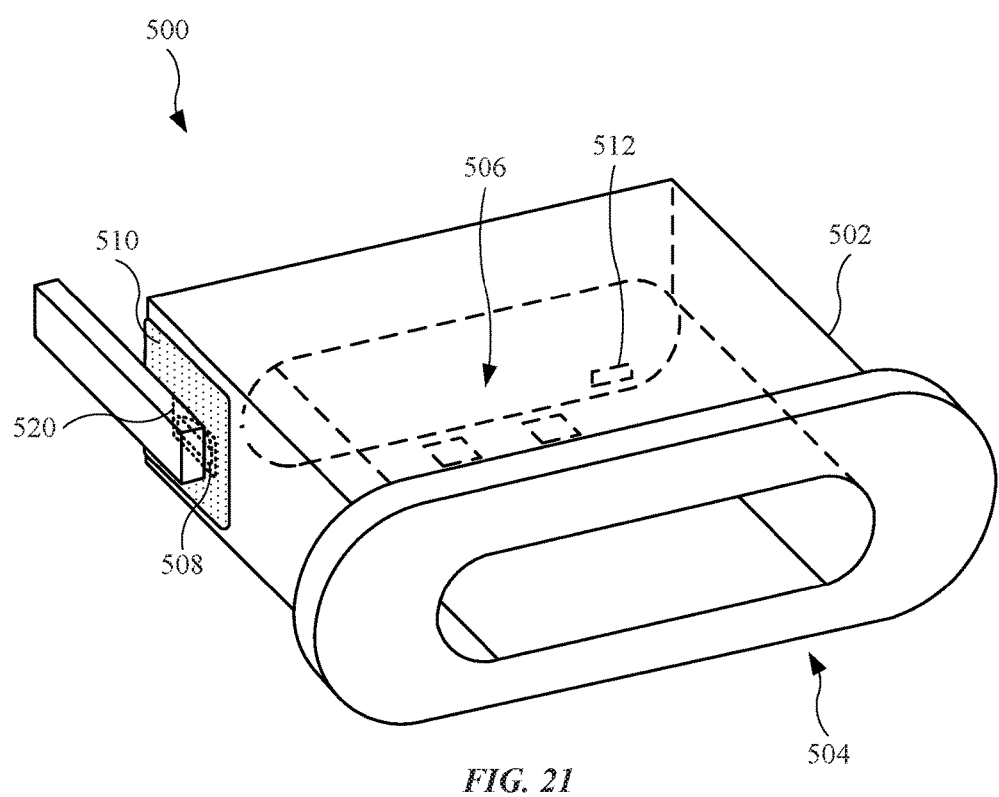
FIG. 21 illustrates an isometric view of the dock.

FIG. 21 illustrates an isometric view of the dock assembly 500. The dock assembly 500 may include a dock body 502 having an opening 504, or cavity, designed to receive a connector (not shown). The dock assembly 500 may further include terminals 506 electrically coupled with one or more circuit boards (previously described). The terminals 506 are designed to electrically couple the connector with one or more of the circuit boards. The dock assembly 500 may further include a protrusion 508 designed to mate and engage with the connector, when the connector is in the opening 504, to provide a frictional force that maintains the connector within the opening 504 and maintains the connector in electrical communication with the terminals 506. The dock assembly 500 may further include a first sealing element 510 that seals an opening 520 (formed in the dock body 502) that receives the protrusion 508. In some embodiments, the first sealing element 510 includes an adhesive. However, other types of materials are possible, such as a compliant material previously described for a sealing element. As shown, the first sealing element 510 is located on a wall that includes the opening 520 through which the protrusion 508 passes. However, the first sealing element 510 may extend to an additional wall. This will be discussed below. Also, the dock assembly 500 may include a moisture detection sensor 512 that detects moisture that enters the opening 504.

Figure 22:
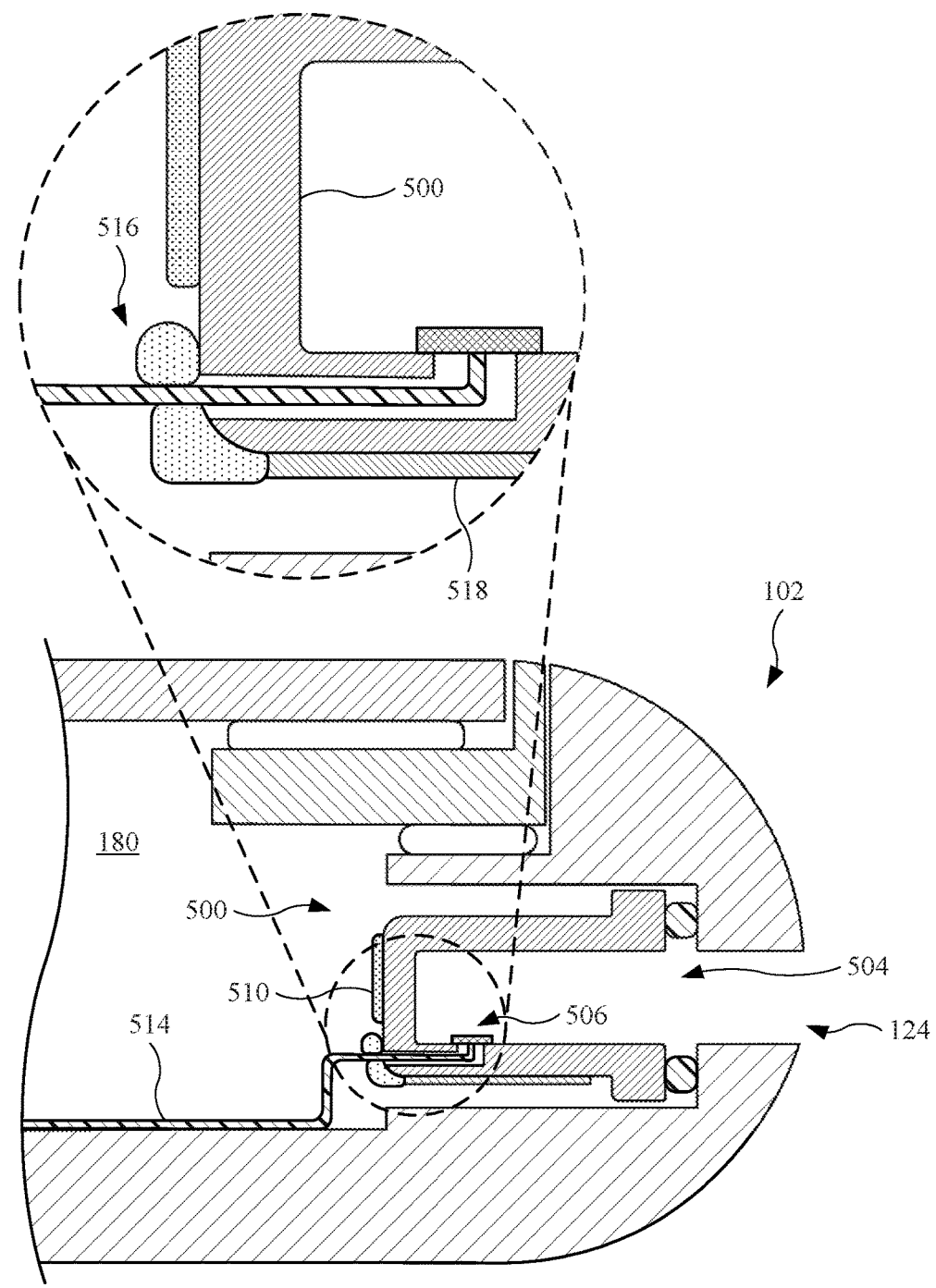
FIG. 22 illustrates a cross sectional view of the dock shown in FIG. 21, showing the dock inserted into the enclosure.

In order for the dock assembly 500 to prevent liquid ingress into an electronic device (that includes the dock assembly 500), the various features of the dock assembly 500 require several openings that are sealed. For example, FIG. 22 illustrates a cross sectional view of the dock assembly 500 shown in FIG. 21, showing the dock assembly 500 inserted into the enclosure 102. The opening 504 of the dock assembly 500 aligns with the opening 124 such that a connector (not shown) may extend through the opening 124 of the enclosure 102 and into the dock assembly 500. The terminals 506 may electrically couple with a circuit 514 that passes through a rear opening of the dock assembly 500. As shown in the enlarged view, the dock body 502 may include a second sealing element 516 that seals the rear opening to prevent liquid entering the dock body 502 from further passing through the rear opening and into the internal volume 180. The second sealing element 516 may include any material previously described for the first sealing element 510. Also, the first sealing element 510 may extend across a rear portion, or a second wall, of the dock assembly 500 to provide further ingress protection. For example, the moisture detection sensor 512 (shown in FIG. 21) may include an electronic moisture detection circuit electrically coupled with the circuit 514. In this instance, the moisture detection sensor 512 requires an opening (not shown) along the rear portion in order to electrically couple with the circuit 514. The first sealing element 510 may cover at least a portion of the opening to provide ingress protection at the moisture detection sensor 512. Also, the dock assembly 500 may include a plate 518 secured with the dock assembly 500. The plate 518 may include a plastic plate secured with the dock assembly 500 by a laser welding operation, as a non-limiting example. The plate 518 facilitates covering the openings of the dock assembly 500, and may combine with the second sealing element 516 to provide the dock assembly 500 with a liquid-resistant barrier.

Figure 23:
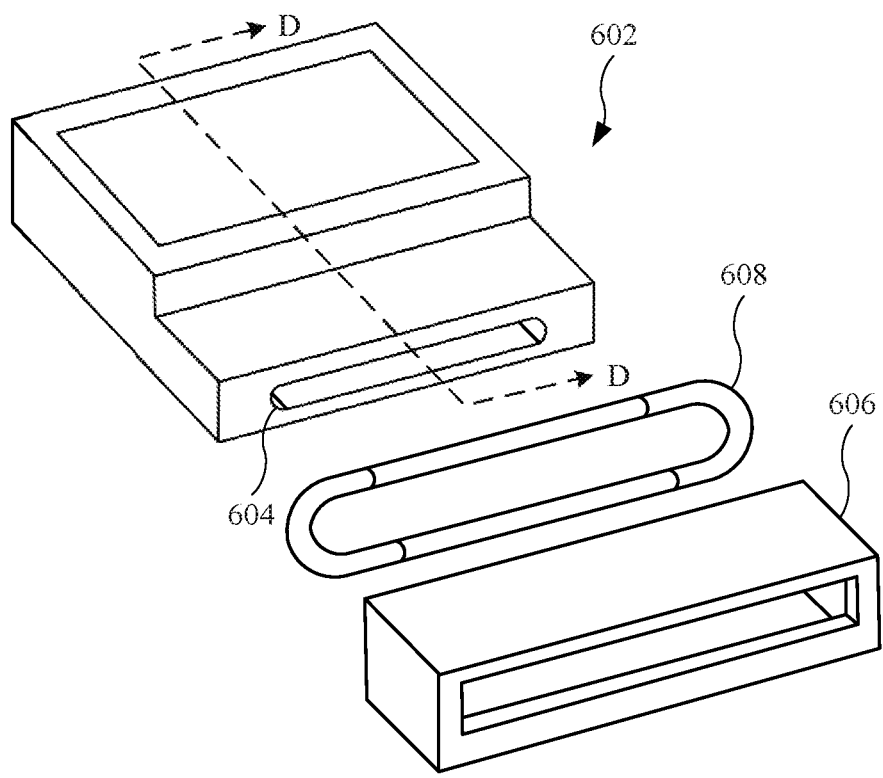
FIG. 23 illustrates an isometric view of the speaker module and associated components used with the speaker module.

FIG. 23 illustrates an isometric view of the speaker module 602 and associated components used with the speaker module 602. As shown, when the speaker module 602 is positioned in the electronic device 100 (shown in FIG. 4), the speaker opening 604 aligns with an opening of the electronic device, thereby allowing acoustical energy generated from speaker module 602 to exit the speaker opening 604 and the electronic device opening. In order to provide a liquid-resistant seal, the speaker module 602 may include a sealing element 608 designed to secure between a portion of the speaker module 602 and the bracket 606. The sealing element 608 may include a compliant, liquid-resist material that conforms in response to compressive forces. Also, although not shown, an additional sealing element may surround the bracket 606 such that the additional sealing element engages the bracket and the enclosure 102 (shown in FIG. 4) when the speaker module 602 is inserted into to the electronic device.

Figure 24:
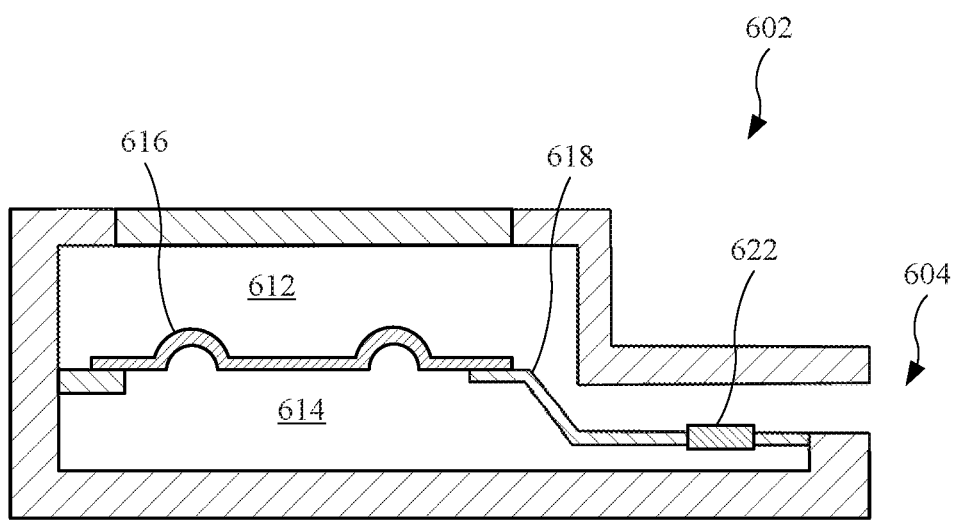
FIG. 24 illustrates a cross sectional view of the speaker module shown in FIG. 23, taken along line D-D, showing liquid-resistant modifications to the speaker module.

FIG. 24 illustrates a cross sectional view of the speaker module 602 shown in FIG. 23, taken along line D-D, showing liquid-resistant modifications to the speaker module 602. For example, the speaker module 602 may include an acoustic volume that includes a front volume 612 and a back volume 614. The front volume 612 and the back volume 614 are separated at least partially by a membrane 616, with the front volume 612 opening to the speaker opening 604 and the back volume 614 fully enclosed by multiple components. The speaker module 602 may further include a membrane 616 designed to vibrate at various frequencies to produce acoustical energy. Also, the membrane 616 may include a liquid-resistant membrane such that the membrane 616 is not damaged when exposed to liquid. In this regard, the membrane 616 may include silicone, as a non-limiting example. The speaker module 602 may further include an internal bracket 618 that receives the membrane 616. The internal bracket 618 may include a liquid-resistant material, such as plastic. The internal bracket 618 may combine with the membrane 616 to define a partition in the speaker module 602 that separates the front volume 612 from the back volume 614, in which the front volume 612 may receive liquid through the speaker opening 604 without causing damage to the speaker module 602 as the sensitive components (not shown) may be positioned within the back volume 614. Further, in order to provide pressure relief to the back volume 614, the internal bracket 618 may include an air vent 622 that includes an air-permeable, liquid resistant material designed to let air flow into and out of the back volume 614.

Figure 25:
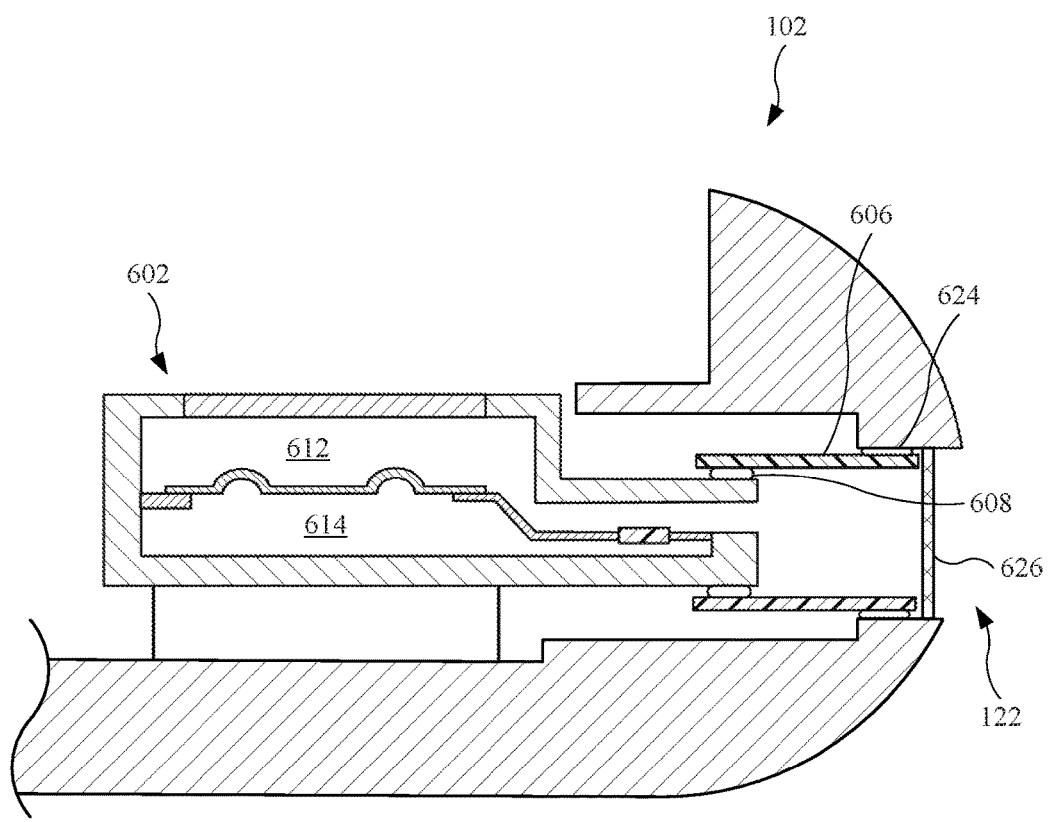
FIG. 25 illustrates a cross sectional view of the speaker module and associated components disposed in the enclosure.

FIG. 25 illustrates a cross sectional view of the speaker module 602 and associated components disposed in the enclosure 102. As shown, the speaker module 602 is positioned in the enclosure 102 and aligned with the openings 122 (both of which are shown in FIG. 4). Also, a mesh material 626 may cover the openings 122 and provide an aesthetic finish. The bracket 606 may secure with the speaker module 602 by an adhesive 624 that include a liquid-resistant adhesive. Also, the sealing element 608 is positioned between the speaker module 602 and the bracket 606 to form an ingress barrier between the speaker module 602 and the bracket 606. In this manner, the speaker module 602 is positioned in the enclosure 102 such that any liquid entering the openings 122 may extend into the front volume 612 but not the back volume 614. Also, any air entering the openings 122 may extend into both the front volume 612 and the back volume 614, with the latter using the air vent (not labeled, shown in FIG. 24) to receive air. Accordingly, the speaker module 602 may provide acoustical energy without promoting liquid ingress throughout an electronic device.

Figure 26:
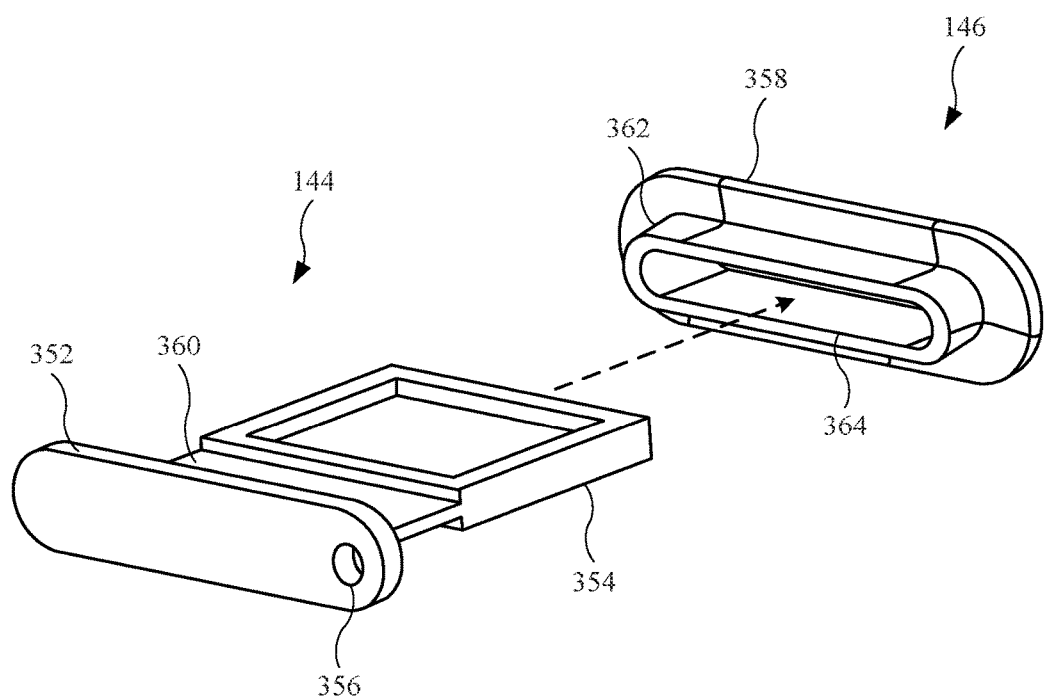
FIG. 26 illustrates an isometric view of the tray and the sealing element used with the tray to limit or prevent liquid ingress.

FIG. 26 illustrates an isometric view of the tray 144 and the sealing element 146 used with tray 144 to limit or prevent liquid ingress. As shown, the tray 144 may include a head portion 352 and a body portion 354 extending from the head portion 352. The head portion 352 may include an opening 356 designed to receive a tool (not shown) such that when the tray 144 is in the electronic device 100 (shown in FIG. 4), the tool can actuate an ejection apparatus (not shown) that causes the tray 144 to eject from the electronic device. Further, when the tray 144 is inserted into the electronic device, the head portion 352 may be co-planar, or flush, with respect to a portion of the enclosure 102 (shown in FIG. 2). The body portion 354 is designed to receive and carry a SIM card (not shown). Further, the body portion 354 may include a recessed portion 360 designed to receive the sealing element 146.

The sealing element 146 may include a compliant, liquid-resistant material such as silicone, as a non-limiting example. As shown in FIG. 26, the sealing element 146 may include a first section 358 and a second section 362. Further, the sealing element 146 may include an opening 364 that allows the tray 144 to be inserted through the sealing element 146 via the opening 364. The opening 364 allows the sealing element 146 to be formed from a single piece material, and accordingly, the sealing element 146 may be referred to as a single piece sealing element. Further, when the sealing element 146 is secured to the tray 144, the second section 362 may be secured with the tray 144 at the recessed portion 360. The first section 358 may bend or compress, in response to a force, causing the first section 358 to bend and/or deform relative to the second section 362. Further, in some instances, the first section 358 may collapse onto the second section 362. This will be shown below.

Figure 27:
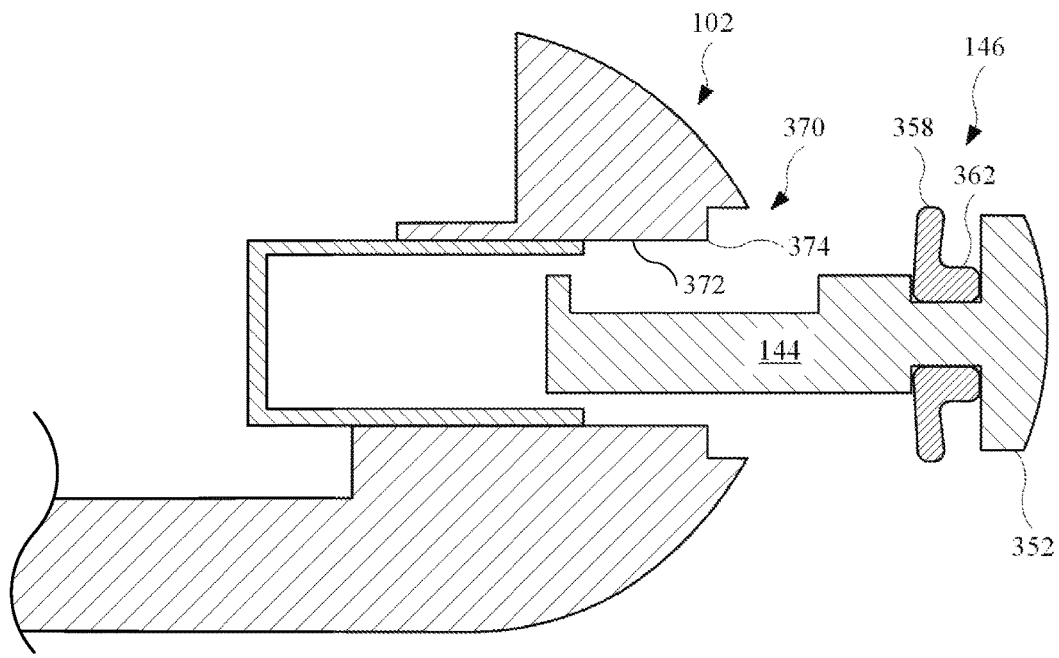
FIG. 27 illustrates a cross sectional view of the tray and the sealing element shown in FIG. 26, showing the tray and the sealing element partially positioned in an opening of the enclosure.

FIG. 27 illustrates a cross sectional view of the tray 144 and the sealing element 146 shown in FIG. 26, showing the tray 144 and the sealing element 146 partially positioned in an opening 370, or through hole, of the enclosure 102. As shown in FIG. 27, the sealing element 146 is not under any compressive force and is generally undisturbed. Further, with no forces acting on the sealing element 146, the first section 358 is perpendicular, or at least substantially perpendicular, with respect to the second section 362.

The opening 370 is designed to receive not only the tray 144, but also the sealing element 146. The opening 370 may include an internal surface 372 designed to engage the sealing element 146, and in particular, the first section 358. When the tray 144 is fully inserted into the opening 370 (shown below), at least a portion of the sealing element 146 engages and deforms. In this regard, the opening 370 may include a notch 374 positioned in the opening 370 such that when the tray 144 slides into the opening 370, the first section 358 will engage the notch 374, causing the first section 358 to bend or deform (relative to the second section 362). In addition to serving as a contact point of the sealing element 146, the notch 374 may provide a stop for the tray 144. This will be shown below.

Figure 28:
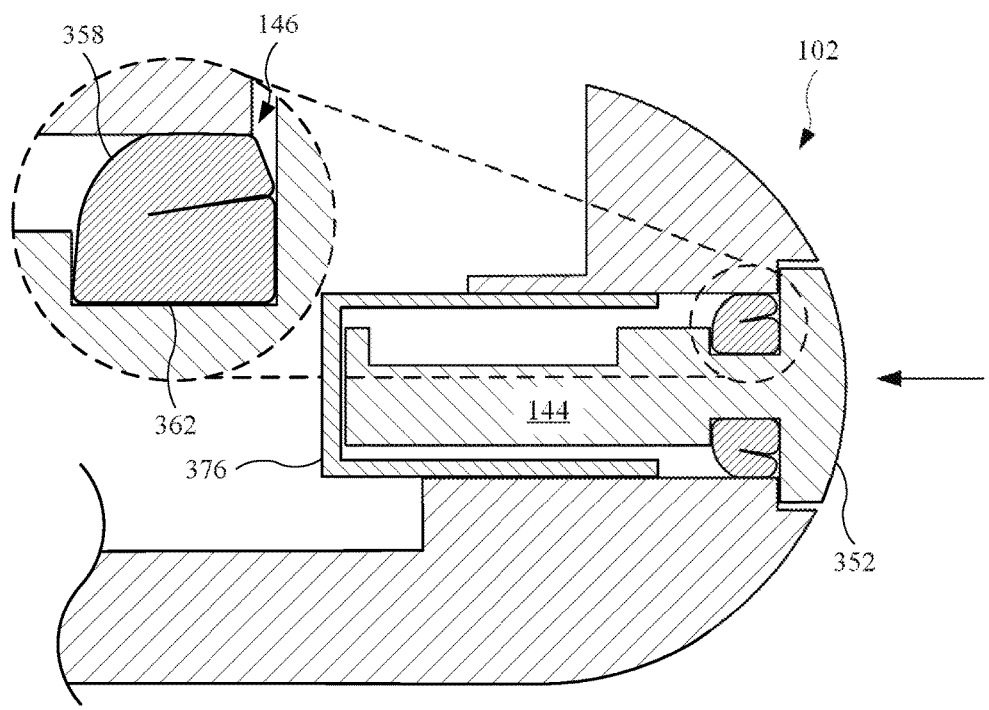
FIG. 28 illustrates a cross sectional view of the tray and the sealing element shown in FIG. 27, showing the tray and the sealing element positioned in the enclosure.

FIG. 28 illustrates a cross sectional view of the tray 144 and the sealing element 146 shown in FIG. 27, showing the tray 144 and the sealing element 146 positioned in the enclosure 102. The tray 144 may be "fully inserted" into the enclosure 102 when a surface of the head portion 352 is co-planar, or flush, with respect to a surface of the enclosure 102, as shown in FIG. 28. Further, the 144 may be fully inserted when a tray housing 376 receives the tray 144, as shown in FIG. 28. As shown, when the tray 144 is fully inserted within the opening 370 (labeled above) of the enclosure 102, the sealing element 146 bends. For example, as shown in the enlarged view, the first section 358 bends relative to the second section 362. Further, in some instances, the first section 358 may bend sufficiently enough to collapse onto and engage the second section 362. However, the first section 358 remains circumferentially engaged with the internal surface 372 of the opening 370 (both labeled in FIG. 27). As a result, when the tray 144 is inserted in the enclosure 102, as shown in FIG. 28, the opening 370 is sealed from liquid ingress by the sealing element 146. Also, in addition to providing a seal against a liquid (or liquids), the sealing element 146 may also center the tray 144, in multiple dimensions, with respect to the tray housing 376.

Figure 29:
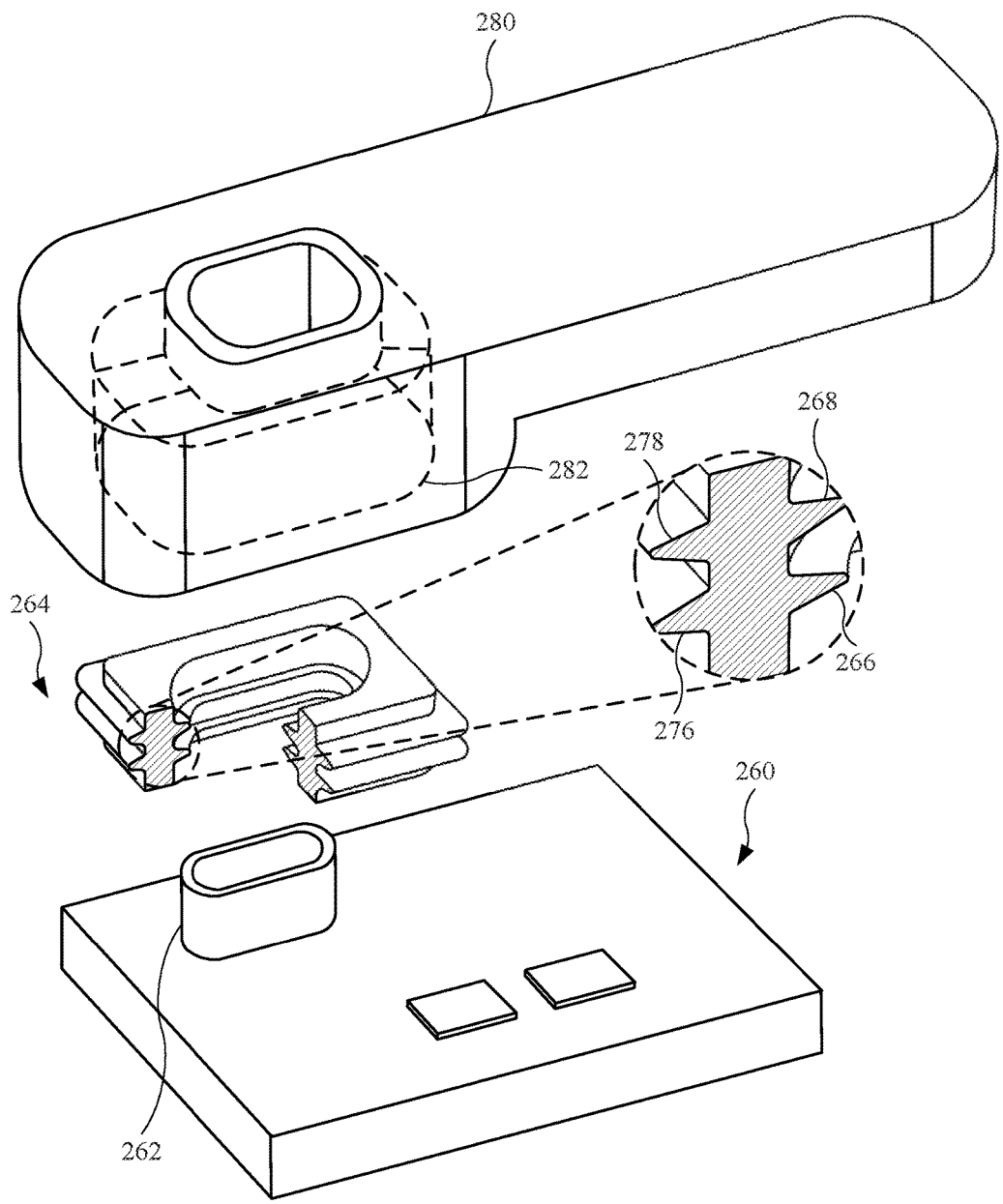
FIG. 29 illustrates an isometric view of the audio module and associated components used with the audio module that are designed to limit or prevent liquid ingress.

FIG. 29 illustrates an isometric view of the audio module 260 and associated components used with the audio module 260 that are designed to limit or prevent liquid ingress. The audio module 260 may generate acoustical energy. In this regard, the audio module 260 may be used as a speaker that emits acoustical energy through a snout 262.

In order to provide an ingress barrier, the sealing element 264, shown as a partial cross section, may be fitted onto the snout 262. The sealing element 264 may include a compliant, liquid-resistant material that deforms in response to compressive forces. Further, the sealing element 264 may include several extensions, or flaps, designed to bend. As shown in the enlarged view, the sealing element 264 may include a first interior extension 266 and a second interior extension 268. The first interior extension 266 and the second interior extension 268 may bend or deform in response to engaging the snout 262. Also, when the sealing element 264 is fitted onto the snout 262, the first interior extension 266 and the second interior extension 268 are designed to compress against the snout 262 and provide a liquid-resistant seal between the sealing element 264 and the audio module 260 (at a location around the snout 262).

Further, an audio module interface 280 can be used to interface with an additional component, such as the opening 108 of the protective layer 106 (shown in FIG. 1). The audio module interface 280 may adhesively secure with the protective layer 106 around the opening 108, thereby forming a liquid-resistant seal. Also, the audio module interface 280 may include an opening 282 to receive the sealing element 264 and the snout 262. This will be shown below. Also, the sealing element 264 may further include a first exterior extension 276 and a second exterior extension 278. The first exterior extension 276 and the second exterior extension 278 may bend or deform in response to the sealing element 264 being positioned in the opening 282.

Figure 30:
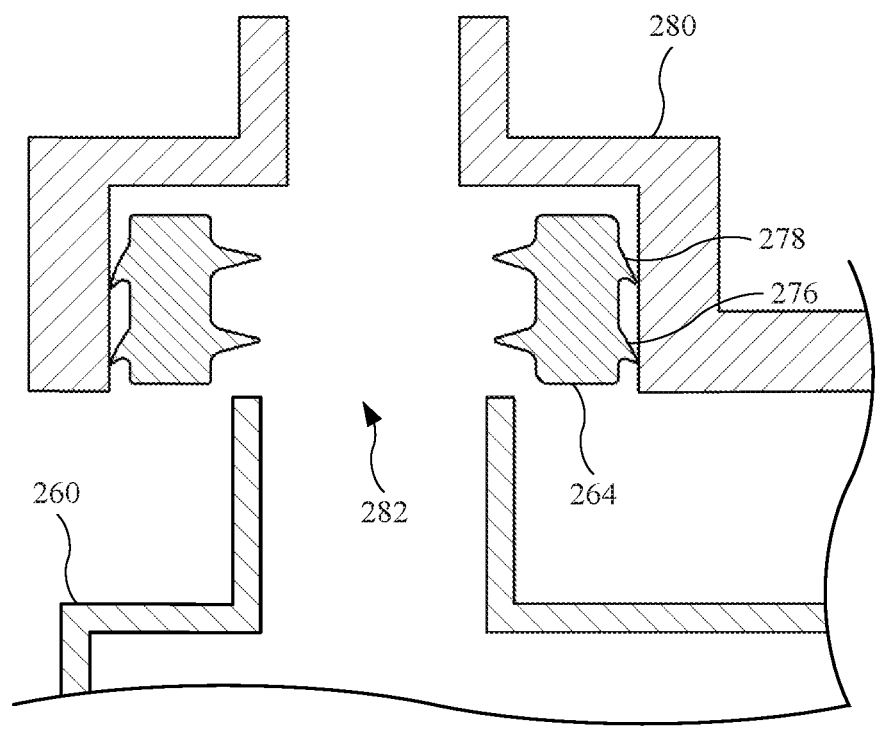
FIG. 30 illustrates a cross sectional view of the audio module shown in FIG. 29, showing the sealing element disposed in the opening of the audio module interface.

FIG. 30 illustrates a cross sectional view of the audio module 260 shown in FIG. 29, showing the sealing element 264 disposed in the opening 282 of the audio module interface 280. As shown, when the sealing element 264 is in the opening 282, the first exterior extension 276 and the second exterior extension 278 bend against the audio module interface 280 along the circumference of the opening 282. This bending action may compress the aforementioned extensions and enhance the seal between the audio module interface 280 and the sealing element 264.

Figure 31:
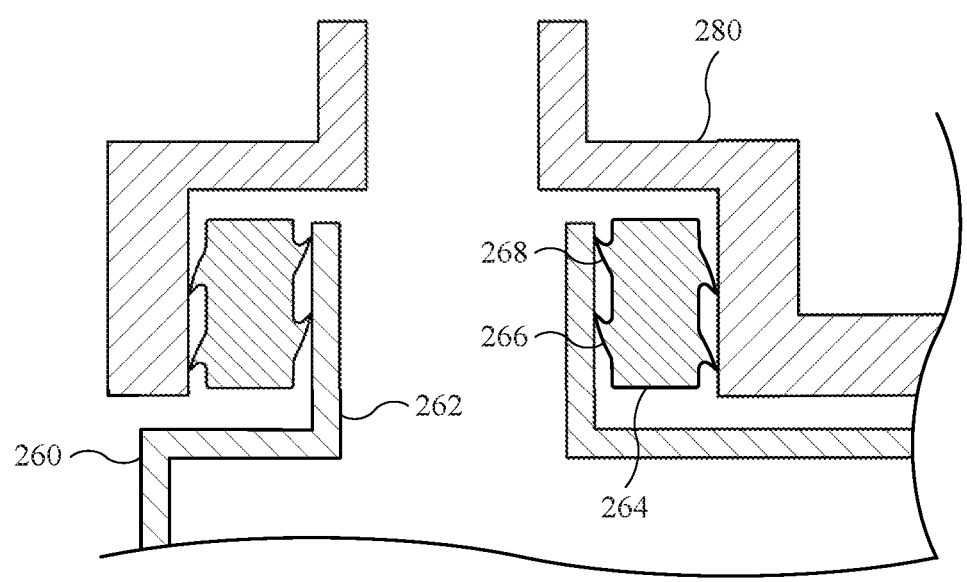
FIG. 31 illustrates a cross sectional view of the audio module shown in FIG. 30, further showing the audio module secured with the sealing element.

FIG. 31 illustrates a cross sectional view of the audio module 260 shown in FIG. 30, further showing the audio module 260 secured with the sealing element 264. As shown, when the snout 262 is positioned in the sealing element 264, the first interior extension 266 and the second interior extension 268 bend against the snout 262. This may enhance the seal between the audio module 260 and the sealing element 264. Accordingly, the sealing element 264 may provide a liquid-resistant seal between the audio module 260 and the audio module interface 280, and the audio module interface 280 may secure with the protective layer 106 (shown in FIG. 1) in a manner that prevents liquid passing through the opening 108 (shown in FIG. 1) from further extending around the sealing element 264.

Figure 32:
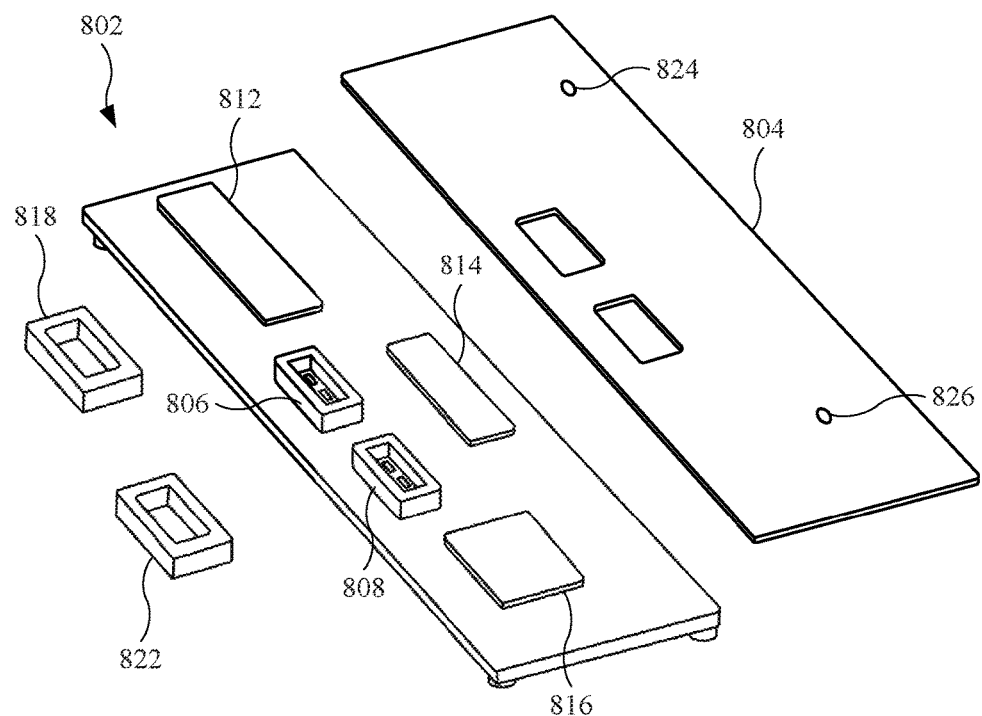
FIG. 32 illustrates an exploded view of the circuit board, along with several elements used to provide an ingress barrier for the circuit board.

FIG. 32 illustrates an exploded view of the main circuit board 802, along with several elements used to provide an ingress barrier for the main circuit board 802. As shown, an encapsulating material 804 may be applied to the circuit board. The encapsulating material 804 may be applied by a deposition procession, including vapor deposition, in order to reduce the overall space occupied by the encapsulating material 804. Also, the encapsulating material 804 may include a hydrophobic material designed to resist some liquids. In this manner, the encapsulating material 804 may block water, for example, that would otherwise engage the main circuit board 802. The encapsulating material 804 may cover internal components, such as a first internal component 812, a second internal component 814, and a third internal component 816. In this regard, the first internal component 812, the second internal component 814, and the third internal component 816 are protected against liquid exposure, which is particularly useful when any of the aforementioned internal components includes an integrated circuit or other operational component susceptible to damage from water.

While the encapsulating material 804 may cover the main circuit board 802 and its internal components, the encapsulating material 804 may not cover the connectors. For example, the main circuit board 802 may include a first connector 806 and a second connector 808, both of which may be used to electrically couple the main circuit board 802 with another circuit board (not shown) or another electrical component (not shown). As shown, the encapsulating material 804 includes openings in locations corresponding to the first connector 806 and the second connector 808. In order to shield the first connector 806 and the second connector 808, the first connector 806 and the second connector 808 may be surrounded by a first sealing element 818 and a second sealing element 822, respectively. In some embodiments, each of the first sealing element 818 and the second sealing element 822 includes a closed-cell foam. However, in some embodiments, each of the first sealing element 818 and the second sealing element 822 includes an open-cell foam. The first sealing element 818 and the second sealing element 822 may combine with connectors (not shown) to seal the first connector 806 and the second connector 808, respectively. This will be shown below.

Also, in the event that liquid enters an electronic device, a determination can be made whether the main circuit board 802 is exposed to the liquid. In this regard, liquid contact indicators may be applied to the encapsulating material 804 (subsequent to the encapsulating material 804 deposited on the main circuit board 802). For instance, a first liquid contact indicator 824 and a second liquid contact indicator 826 are applied to the encapsulating material 804. Both the first liquid contact indicator 824 and the second liquid contact indicator 826 are designed to change their appearance (change in color, for example) to provide a visual indication that the first liquid contact indicator 824 and the second liquid contact indicator 826 have been exposed to liquid.

Figure 33:
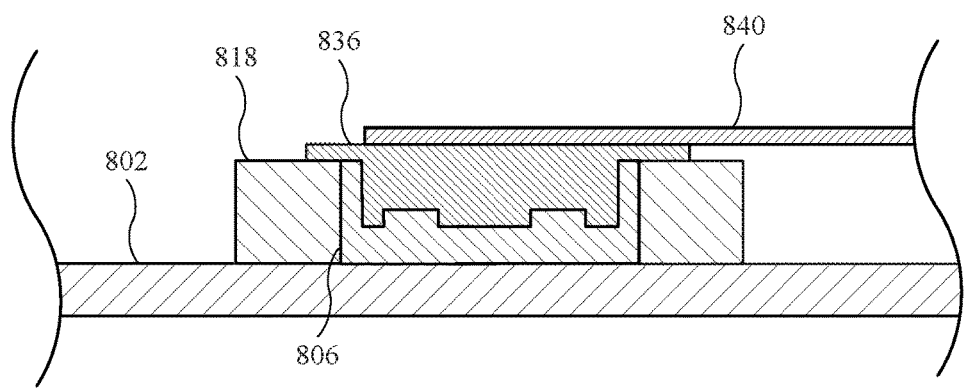
FIG. 33 illustrates a cross sectional view of the circuit board shown in FIG. 32, further showing the first sealing element surrounding the first connector, and the first connector connected with a circuit connector.

FIG. 33 illustrates a cross sectional view of the main circuit board 802 shown in FIG. 32, further showing the first sealing element 818 surrounding the first connector 806, and the first connector 806 connected with a circuit connector 836 that is coupled with a circuit 840, which may include a flexible circuit. As shown, the circuit connector 836 may surround the first connector 806 and combine with the first sealing element 818 to provide an ingress barrier for the first connector 806.

As discussed above, an enclosure of an electronic device may undergo an anodization process. However, the anodization process may alter the enclosure such that the outer perimeter, or exterior, is no longer electrically conductive. In instances when the enclosure 102 (shown in FIG. 4) is used in part as an electrical ground, the enclosure 102 may no longer provide the electrical ground. However, the outer perimeter may undergo a laser ablation operation to remove an anodization layer, thereby exposing an electrically conductive portion of the enclosure. The laser ablation operation may be used along receiving points and screw points, each designed to receive a component, such as a fastener, thereby allowing the receiving points and screw points to provide an electrically conductive path.

Figure 34:
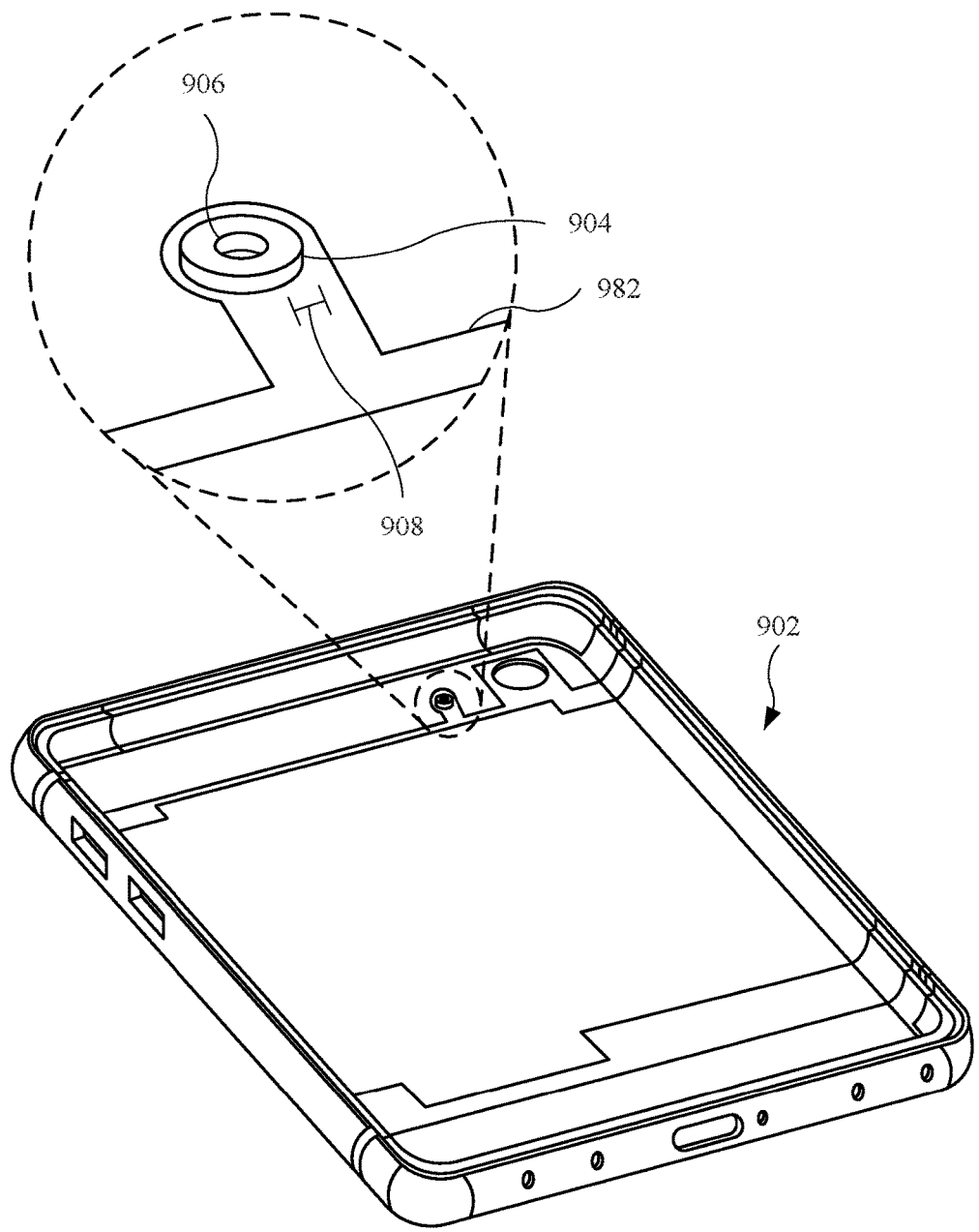
FIG. 34 illustrates an isometric view of an alternate embodiment of an enclosure suitable for an electronic device, showing a receiving element used to receive a fastener, in accordance with some described embodiments.

However, in order to prevent the laser ablation operation from removing the insert molded layers and/or the liquid resistant coating, the receiving points may be modified. For example, FIG. 34 illustrates an isometric view of an alternate embodiment of an enclosure 902 suitable for an electronic device, showing a receiving element 904 used to receive a fastener (not shown), in accordance with some described embodiments. The enclosure 902 may include any feature or features previously described for an enclosure. As shown in the enlarged view, the receiving element 904 may include an opening 906 designed to mate with a fastener or another component (not shown). The opening 906 may undergo a laser ablation operation to remove an anodization layer to expose an electrically conductive portion of the enclosure 902. In this manner, when the fastener or component is positioned in the opening 906, the fastener or component may be electrically coupled to the enclosure 902.

As shown, a layer 982, similar to the first layer 182 (shown in FIGS. 5 and 6) surrounds the receiving element 904. Also, the enclosure 902 may further include a coating layer (not shown) designed to prevent liquid ingress into the enclosure 902, similar to a manner previously described. In order to prevent the layer 982 and any coating layer from burning off, or otherwise being removed, during the laser ablation operation, the receiving element 904 may include a radial thickness 908 extending from the opening 906 to an edge of the receiving element 904. The radial thickness 908 provides additional space between the layer 982 and the opening 906. In this manner, during the laser ablation operation, the layer 982 (and any coating applied to the layer 982) is not removed by the laser ablation.

Figure 35:
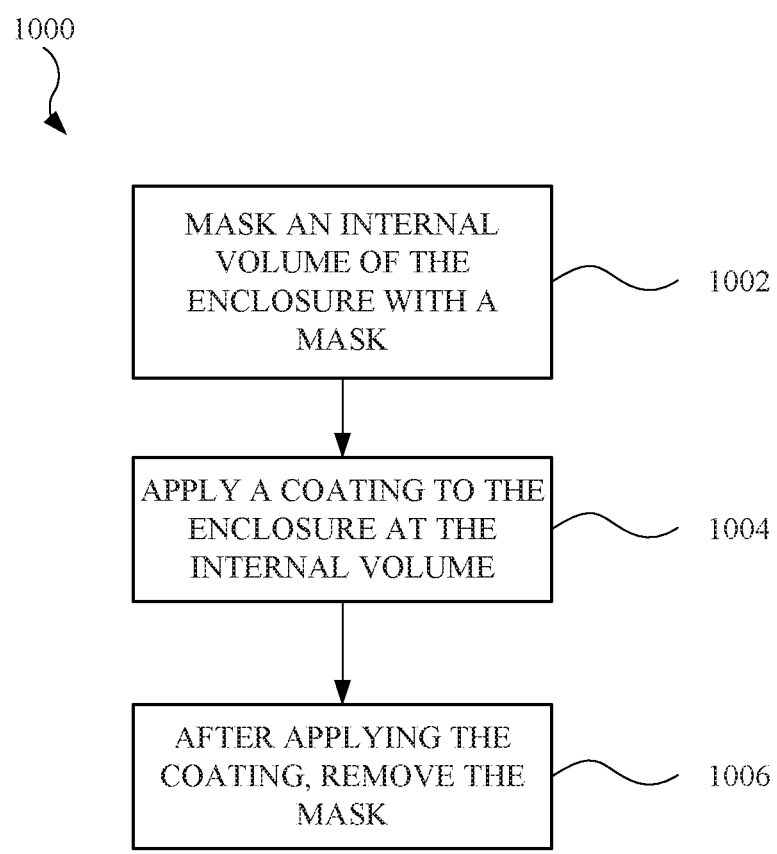
FIG. 35 illustrates a flowchart showing a method for forming an electronic device that prevents liquid ingress through an enclosure of the electronic device, in accordance with some described embodiments.

FIG. 35 illustrates a flowchart 1000 showing a method for forming an electronic device that prevents liquid ingress through an enclosure of the electronic device, in accordance with some described embodiments. The enclosure may be formed from a metal and may include a channel that opens to an internal volume of the electronic device, with the internal volume defined by the enclosure.

In step 1002, a mask is used to mask, or cover, an infernal internal volume of the enclosure. The mask may include a removable mask. In this manner, when the mask is removed, any material applied to the mask is also removed. Further, the mask may allow the enclosure to retain electrically conductive portions.

In step 1004, a coating is applied to the enclosure at the internal volume. The coating may provide a seal against the liquid ingress passing through the channel. The coating may include a liquid-resistant material, such as polyurethane. Also, the coating may be applied by one or more techniques, including spraying and painting, as non-limiting examples.

In step 1006, after applying the coating, the mask is removed. The portion of the coating that is applied to the mask is also removed with the mask, while the portion uncovered by the mask remains on the enclosure at the internal volume. The portion in which the coating does not cover the enclosure, which may include a chassis of the enclosure, can be used as an electrical grounding pathway of the enclosure. In this regard, any component electrically connected to the enclosure can be electrically grounded. This may allow for the removal of static charge on the component.

Figure 36:
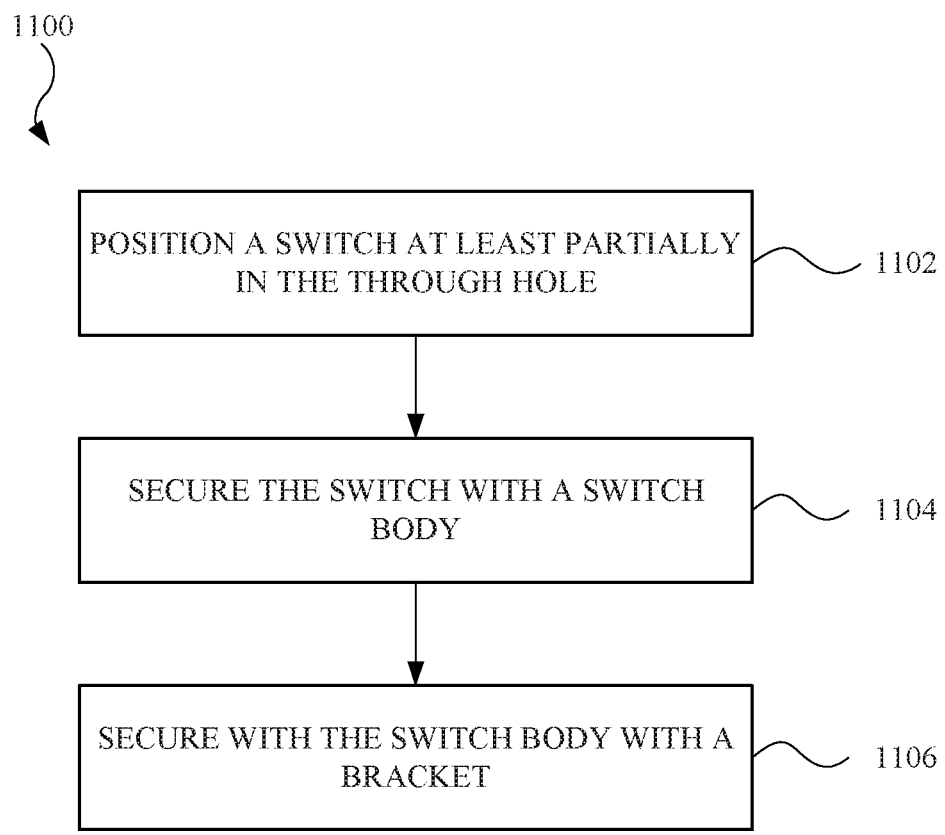
FIG. 36 illustrates a flowchart showing a method for forming an electronic device having an enclosure, in accordance with some described embodiments.

FIG. 36 illustrates a flowchart 1100 showing a method for forming an electronic device having an enclosure, in accordance with some described embodiments. The enclosure may include a through hole. In step 1102, a switch is positioned at least partially in the through hole. The switch may be used as an input device to control a function (or functions) of the electronic device, such as a volume adjustment (e.g., muting).

In step 1104, the switch is secured with a switch body. The switch body is designed to carry or hold the switch, while also allowing the switch to move/actuate relative to the switch body. Also, in some instances, the switch body is coated by a film design to provide the switch body with ingress protection. Also, the switch body may electrically couple with a circuit that relays control signals generated by the switch.

In step 1106, the switch body is secured with a bracket. The bracket may include a sealing element that engages the enclosure at the through hole to prevent liquid ingress from entering the enclosure at the through hole. The sealing element may include a compliant material that conforms to the dimensions of the enclosure, and in particular, the dimensions of the through hole.

Figure 37:
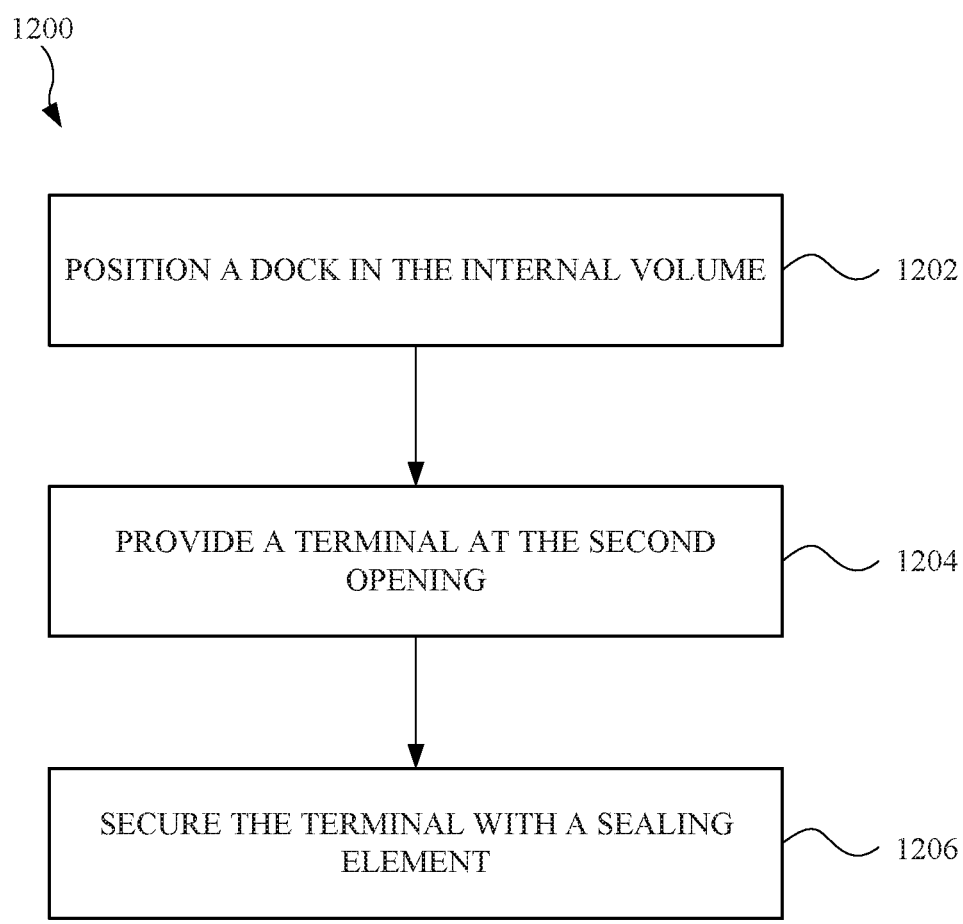
FIG. 37 illustrates a flowchart showing a method for forming an electronic device having an enclosure defines an internal volume, in accordance with some described embodiments.

FIG. 37 illustrates a flowchart 1200 showing a method for forming an electronic device having an enclosure defines an internal volume, in accordance with some described embodiments. The enclosure may include a through hole that opens to the internal volume. In step 1202, a dock is positioned in the internal volume. The dock is designed to receive and electrically couple to a connector that can supply data and/or electrical power to the electronic device. The dock may include a first opening that is aligned with the through hole such that the first opening may receive the connector. Also, the dock may further include a second opening.

In step 1204, a terminal is provided at the second opening. The terminal is configured to electrically couple with the connector when the connector is inserted into the first opening. Accordingly, the terminal may include an electrically conductive material, such as a metal. Also, the terminal may be electrically coupled to a circuit inside the electronic device. In this manner, the circuit can carry electrical signals, in the form of data or electrical power, throughout the electronic device.

In step 1206, the terminal is secured with a sealing element. The sealing element is designed to cover the second opening and prevent a liquid from entering the internal volume via the second opening. In some instances, the sealing element includes an adhesive. In this manner, the sealing element not only provides a seal but also adhesively secures the terminal with the second opening.

Figure 38:
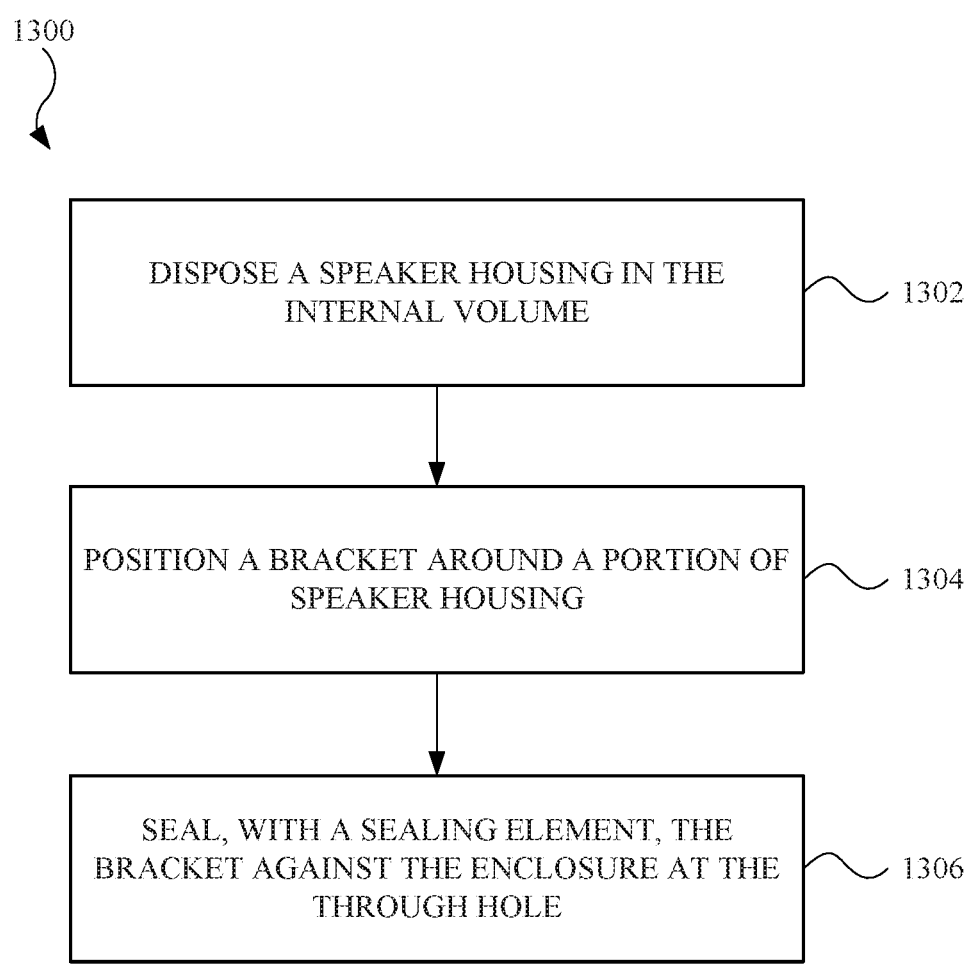
FIG. 38 illustrates a flowchart showing a method for assembling an electronic device that includes an enclosure that defines an internal volume, in accordance with some described embodiments.

FIG. 38 illustrates a flowchart 1300 showing a method for assembling an electronic device that includes an enclosure that defines an internal volume, in accordance with some described embodiments. The enclosure may include a through hole that opens to the internal volume. In step 1302, a speaker housing is disposed in the internal volume. The speaker housing may include a speaker opening that is aligned with the through hole. Also, with the exception of the speaker opening, the speaker housing may be free of additional openings, or may include an opening(s) covered by an airtight seal, such that the speaker housing defines an acoustic volume (including a front and back volume) that is maintained separately from air inside the internal volume.

In step 1304, a bracket is positioned around a portion of speaker housing. For example, the bracket may at least partially surround a portion of the speaker housing associated with the speaker opening, thereby providing additional support to the speaker housing along the speaker module. Also, the bracket may adhesively secure with the enclosure at or near the through hole. The adhesive used to secure the bracket to the enclosure may include a liquid-resistant adhesive.

In step 1306, a sealing element seals the bracket against the enclosure at the through hole. The sealing element may be positioned between the bracket and the enclosure, and may also engage the bracket and the enclosure. In this regard, the speaker housing is sealed from air in the internal volume. Further, the speaker housing is positioned and designed to receive or emit air from an external environment outside the electronic device. Also, a speaker module (that includes the speaker housing) can emit acoustic energy from the speaker opening and the through hole. In this regard, the speaker module may include a membrane acoustically driven to generate the acoustical energy.

Figure 39:
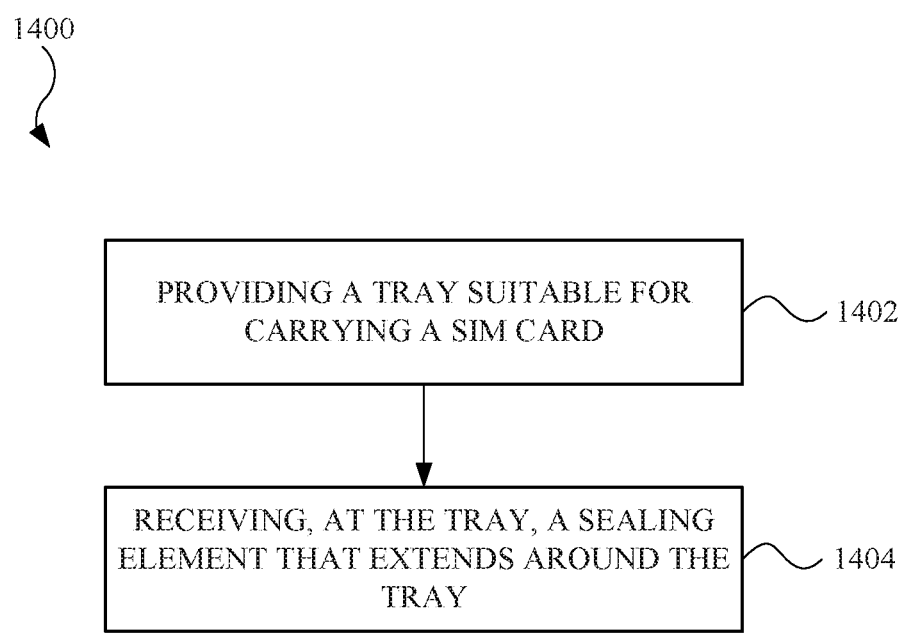
FIG. 39 illustrates a flowchart showing a method for forming an electronic device having an enclosure that includes an internal volume, in accordance with some described embodiments.

FIG. 39 illustrates a flowchart 1400 showing a method for forming an electronic device having an enclosure that includes an internal volume, in accordance with some described embodiments. The enclosure may include a through hole that opens to the internal volume. In step 1402, a tray is provided. The tray may be suitable for carrying a SIM card. In this regard, the tray may be referred to as a SIM tray.

In step 1404, the tray receives a sealing element. The sealing element extends around the tray. In this manner, when the tray is inserted into the through hole, the sealing element bends against the enclosure at the through hole, thereby forming a seal at the through hole. The sealing element may include a first section and a second section connected to the first section. When the tray is inserted into the through hole, the first section may bend or collapse onto, or in a direction toward, the second section. Further, the first section may remain engaged with the enclosure such that the sealing element provides a seal or shield against liquid ingress at the through hole.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An electronic device, comprising:
    an enclosure that defines an internal volume;
    a through hole formed in the enclosure and having an internal surface, the through hole in communication with the internal volume;
    a subscriber identification module (SIM) tray that is movable with respect to the enclosure; and
    a sealing element having a first section and a second section and an opening, the second section being secured with the SIM tray when the SIM tray is positioned in the opening, wherein when the SIM tray is inserted into the through hole the first section engages the internal surface such that a liquid is prevented from entering the internal volume via the through hole.

2. The electronic device of claim 1, wherein when the SIM tray is inserted into the through hole, the first section collapses onto the second section.

3. The electronic device of claim 1, wherein the enclosure comprises a notch that is located in the through hole, and wherein when the SIM tray is inserted into the through hole, the first section is bent due to engagement with the notch.

4. The electronic device of claim 1, wherein the SIM tray comprises:
a head portion that is co-planar with respect to the enclosure when the tray is fully inserted into the enclosure;
a body portion extending from the head portion and capable of receive a SIM card; and
a recessed portion between the body portion and the head portion, wherein the recessed portion receives the sealing element.

5. The electronic device of claim 4, wherein the second section is positioned at least partially in the recessed portion.

6. The electronic device of claim 1, wherein the enclosure includes a size and shape to receive both the SIM tray and the sealing element.

7. The electronic device of claim 1, wherein the sealing element comprises a compliant PU coating.

8. An electronic device, comprising:
an audio module that generates acoustical energy, the audio module comprising a snout;
an audio module interface that secures with the audio module; and
a sealing element that engages the audio module and the audio module interface, the sealing element comprising a first extension and a second extension, the first extension engaging the audio module interface and the second extension engaging the snout, the sealing element forming a seal that prevents a liquid from entering between the audio module and the audio module interface.

9. The electronic device of claim 8, wherein:
the sealing element comprises an opening, and
the second extension is positioned within the opening.

10. The electronic device of claim 9, wherein the first extension surrounds an exterior portion of the sealing element.

11. The electronic device of claim 8, wherein when the first extension bends against the audio module interface, and wherein the second extension bends against the snout.

12. The electronic device of claim 8, further comprising:
a display assembly; and
a protective layer that covers the display assembly, the protective layer comprising an opening aligned with the audio module interface.

13. The electronic device of claim 8, wherein in the first extension extends in a first direction, and wherein the second extension extends in a second direction opposite the first direction.

14. The electronic device of claim 8, wherein the audio module interface includes an opening that at least partially receives both the sealing element and the snout.

15. The electronic device of claim 8, wherein the sealing element comprises:
multiple extensions engaging the audio module interface; and
multiple extensions engaging the snout.

16. An electronic device, comprising:
an enclosure that includes a bottom wall and sidewalls that combine with the bottom wall to define an internal volume, the sidewalls including a sidewall having a first through hole and a second through hole, the first hole and the second through hole opening to the internal volume;
a button that generates a command to an operational component in the internal volume, the button comprising a first end having a first protrusion extending at least partially in the first through hole, the button further comprising a second end having a second protrusion extending at least partially in the second through hole, the second end opposite the first end;
a first sealing element secured with the first protrusion and engaging the enclosure at the first through hole, thereby forming a first seal from a liquid at the first through hole; and
a second sealing element secured with the second protrusion and engaging the enclosure at the second through hole, thereby forming a second seal from a liquid at the second through hole.

17. The electronic device of claim 16, wherein the first sealing element is positioned on the first protrusion.

18. The electronic device of claim 16, wherein the first protrusion comprises a grooved region that receives the first sealing element.

19. The electronic device of claim 16, wherein the first sealing element and the second sealing element remain engaged with the first through hole and the second through hole, respectively, during actuation of the button.

20. The electronic device of claim 16, wherein when the button is actuated:
the first sealing element moves in conjunction with the first protrusion, and
the second sealing element moves in conjunction with the second protrusion.

21. A method for forming an electronic device having an enclosure that includes an internal volume, the enclosure having a through hole that opens to the internal volume, the method comprising:
providing a SIM tray that carries a SIM card, the SIM tray movable with respect to the enclosure; and
positioning a sealing element onto the SIM tray, the sealing element having a first section and a second section, the second section being secured with the tray, wherein in response to the SIM tray being inserted into the through hole, the through hole deforms the first section relative to the second section and the sealing element forms a seal from a liquid at the through hole, wherein the sealing element comprises a ring that includes an opening such that the SIM tray passes through the ring at the opening.

22. The method of claim 21, further comprising:
forming a recessed region in the SIM tray; and
fitting the sealing element onto the SIM tray at the recessed region.

23. The method of claim 22, fitting the second section onto the recessed region.

24. The method of claim 23, wherein the first section is perpendicular with respect to the second section.

25. The method of claim 21, wherein receiving the sealing element comprises receiving a compliant PU material that forms the sealing element.

26. The method of claim 21, wherein the first section collapses onto the second section when the SIM tray is inserted into the through hole.

27. The electronic device of claim 1, further comprising:
a display assembly;
a frame that carries the display assembly, the frame coupled with the enclosure; and
a second sealing element that prevents a contaminant from entering a location between the frame and the enclosure.

28. The electronic device of claim 1, further comprising:
a switch;
audio modules;
speaker modules;
a fastener;
a port capable of receiving an electrical connector; and
a circuit board.

* * * * *